United States Patent
Yamane et al.

(10) Patent No.: US 10,236,357 B2
(45) Date of Patent: Mar. 19, 2019

(54) SEMICONDUCTOR DEVICE AND MANUFACTURING METHOD OF THE SAME

(71) Applicant: SEMICONDUCTOR ENERGY LABORATORY CO., LTD., Atsugi-shi, Kanagawa-ken (JP)

(72) Inventors: Yasumasa Yamane, Kanagawa (JP); Ryo Tokumaru, Kanagawa (JP); Hiromi Sawai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/697,564

(22) Filed: Sep. 7, 2017

(65) Prior Publication Data

US 2018/0076296 A1 Mar. 15, 2018

(30) Foreign Application Priority Data

Sep. 14, 2016 (JP) .................................. 2016-179466

(51) Int. Cl.
  *H01L 29/49* (2006.01)
  *H01L 21/443* (2006.01)
  (Continued)

(52) U.S. Cl.
  CPC ........ *H01L 29/4908* (2013.01); *H01L 21/443* (2013.01); *H01L 29/24* (2013.01);
  (Continued)

(58) Field of Classification Search
  CPC ............... H01L 29/4908; H01L 21/443; H01L 29/42384
  See application file for complete search history.

(56) References Cited

U.S. PATENT DOCUMENTS 6,876,021 B2  4/2005  Martin et al.
6,924,227 B2  8/2005  Minamihaba et al.
(Continued)

FOREIGN PATENT DOCUMENTS

CN     106256017 A    12/2016
JP     2007-096055    4/2007
(Continued)

OTHER PUBLICATIONS

International Search Report (Application No. PCT/IB2017/055314) dated Dec. 26, 2017.
(Continued)

*Primary Examiner* — Errol Fernandes
(74) *Attorney, Agent, or Firm* — Nixon Peabody LLP; Jeffrey L. Costellia

(57) ABSTRACT

A semiconductor device having stable electrical characteristics is provided. A semiconductor device that can be miniaturized or highly integrated is provided. One embodiment of the present invention includes a transistor including an oxide, a first barrier layer over the transistor, and a second barrier layer in contact with the first barrier layer. The oxide is in contact with an insulator including an excess-oxygen region. The insulator is in contact with the first barrier layer. The first barrier layer has a thickness greater than or equal to 0.5 nm and less than or equal to 1.5 nm. The second barrier layer is thicker than the first barrier layer.

40 Claims, 15 Drawing Sheets

(51) Int. Cl.

| | | |
|---|---|---|
| *H01L 29/24* | (2006.01) | |
| *H01L 29/423* | (2006.01) | |
| *H01L 29/66* | (2006.01) | |
| *H01L 29/786* | (2006.01) | |
| *H01L 21/48* | (2006.01) | |
| *H01L 21/56* | (2006.01) | |
| *H01L 21/78* | (2006.01) | |
| *H01L 21/66* | (2006.01) | |
| *H01L 23/544* | (2006.01) | |
| *H01L 27/105* | (2006.01) | |
| *H01L 27/12* | (2006.01) | |

(52) U.S. Cl.
CPC .. *H01L 29/42384* (2013.01); *H01L 29/66969* (2013.01); *H01L 29/7869* (2013.01); *H01L 29/78648* (2013.01); *H01L 21/4825* (2013.01); *H01L 21/4842* (2013.01); *H01L 21/565* (2013.01); *H01L 21/78* (2013.01); *H01L 22/14* (2013.01); *H01L 23/544* (2013.01); *H01L 27/1052* (2013.01); *H01L 27/124* (2013.01); *H01L 27/1207* (2013.01); *H01L 27/1225* (2013.01); *H01L 27/1255* (2013.01)

(56) References Cited

U.S. PATENT DOCUMENTS

| | | |
|---|---|---|
| 7,598,557 B2 | 10/2009 | Nagai et al. |
| 8,062,978 B2 | 11/2011 | Choi et al. |
| 8,158,975 B2 | 4/2012 | Akimoto |
| 8,228,514 B2 | 7/2012 | Yokoyama |
| 8,313,980 B2 | 11/2012 | Akimoto |
| 8,421,081 B2 | 4/2013 | Kato et al. |
| 8,441,101 B2 | 5/2013 | Wang |
| 8,502,216 B2 | 8/2013 | Akimoto et al. |
| 8,541,780 B2 | 9/2013 | Yamazaki et al. |
| 8,547,771 B2 | 10/2013 | Koyama |
| 8,852,961 B2 | 10/2014 | Wang |
| 8,860,108 B2 | 10/2014 | Yamazaki et al. |
| 8,877,624 B2 | 11/2014 | Hull et al. |
| 8,981,370 B2 | 3/2015 | Tanaka et al. |
| 8,995,174 B2 | 3/2015 | Koyama |
| 9,048,265 B2 | 6/2015 | Hondo et al. |
| 9,099,560 B2 | 8/2015 | Yamazaki |
| 9,318,618 B2 | 4/2016 | Endo et al. |
| 9,564,535 B2 | 2/2017 | Yamazaki et al. |
| 9,704,704 B2 | 7/2017 | Yamazaki et al. |
| 9,768,315 B2 | 9/2017 | Koezuka et al. |
| 2006/0281210 A1 | 12/2006 | Kiuchi et al. |
| 2008/0073685 A1 | 3/2008 | Wang |
| 2012/0032730 A1 | 2/2012 | Koyama |
| 2012/0248432 A1 | 10/2012 | Noda et al. |
| 2012/0273773 A1 | 11/2012 | Ieda et al. |
| 2012/0276694 A1 | 11/2012 | Koezuka et al. |
| 2012/0313152 A1 | 12/2012 | Yokoi et al. |
| 2012/0315730 A1 | 12/2012 | Koezuka et al. |
| 2012/0315735 A1 | 12/2012 | Koezuka et al. |
| 2013/0075735 A1 | 3/2013 | Watanabe et al. |
| 2013/0187161 A1 | 7/2013 | Yamazaki |
| 2013/0228774 A1 | 9/2013 | Okazaki et al. |
| 2013/0228782 A1 | 9/2013 | Yamazaki et al. |
| 2013/0234131 A1 | 9/2013 | Tanaka et al. |
| 2013/0270563 A1 | 10/2013 | Yamazaki |
| 2013/0299824 A1 | 11/2013 | Akimoto et al. |
| 2014/0042434 A1 | 2/2014 | Yamazaki |
| 2014/0087517 A1 | 3/2014 | Akimoto et al. |
| 2014/0097867 A1 | 4/2014 | Koyama |
| 2015/0187950 A1 | 7/2015 | Sato et al. |
| 2015/0249157 A1 | 9/2015 | Yamazaki et al. |
| 2015/0303309 A1 | 10/2015 | Koezuka et al. |
| 2016/0035865 A1 | 2/2016 | Nagamatsu et al. |
| 2016/0118502 A1 | 4/2016 | Yamazaki et al. |
| 2017/0077313 A1* | 3/2017 | Yamazaki ........... H01L 29/7869 |
| 2017/0141234 A1 | 5/2017 | Yamazaki et al. |
| 2017/0263776 A1 | 9/2017 | Yamazaki et al. |

FOREIGN PATENT DOCUMENTS

| | | |
|---|---|---|
| JP | 2007-123861 | 5/2007 |
| JP | 2009-277893 | 11/2009 |
| JP | 2011-119674 | 6/2011 |
| JP | 2015-179839 A | 10/2015 |
| JP | 2015-213165 A | 11/2015 |
| JP | 2016-086172 A | 5/2016 |
| KR | 2015-0102742 A | 9/2015 |
| KR | 2016-0145031 A | 12/2016 |
| TW | 201545359 | 12/2015 |
| WO | WO-2015/159183 | 10/2015 |

OTHER PUBLICATIONS

Written Opinion (Application No. PCT/IB2017/055314) dated Dec. 26, 2017.

* cited by examiner

SEMICONDUCTOR DEVICE AND MANUFACTURING METHOD OF THE SAME

TECHNICAL FIELD

One embodiment of the present invention relates to a semiconductor device and a manufacturing method thereof. Another embodiment of the present invention relates to an electronic device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

BACKGROUND ART

A technique in which a transistor is formed using a semiconductor thin film has attracted attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, the following techniques have been disclosed: a display device is manufactured using a transistor whose active layer is formed of zinc oxide or an In—Ga—Zn-based oxide as an oxide semiconductor (see Patent Documents 1 and 2).

Moreover, in recent years, a technique in which an integrated circuit of a memory device is fabricated using a transistor including an oxide semiconductor has been disclosed (see Patent Document 3). In addition, not only the memory device but also an arithmetic device or other similar devices have been fabricated using a transistor including an oxide semiconductor.

However, it is known that a transistor including an oxide semiconductor as an active layer has a problem in that the electrical characteristics are easily changed by impurities and oxygen vacancies in the oxide semiconductor and thus the reliability is low. For example, the threshold voltage of the transistor is changed in some cases after a bias temperature stress test (BT test).

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

An object of one embodiment of the present invention is to provide a semiconductor device having favorable electrical characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with a high degree of design flexibility. Another object of one embodiment of the present invention is to provide a low-power semiconductor device. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

In one embodiment of the present invention, excess oxygen is supplied to an oxide semiconductor from an insulator in the vicinity of the oxide semiconductor to reduce oxygen vacancies in the oxide semiconductor.

Furthermore, impurities such as water and hydrogen from other components or the like in the vicinity of the oxide semiconductor can be prevented from entering the oxide semiconductor. To prevent the entrance of impurities such as hydrogen from the outside into the oxide semiconductor, an insulator having a barrier property against impurities such as water and hydrogen is formed to cover the oxide semiconductor.

The insulator having a barrier property against impurities such as water and hydrogen is made to have low oxygen permeability. Accordingly, outward diffusion of oxygen can be prevented and oxygen can be effectively supplied to the oxide semiconductor and the oxide insulator in the vicinity of the oxide semiconductor.

In such a manner, impurities such as water and hydrogen contained in the oxide semiconductor and the surrounding oxide insulator can be reduced, and oxygen vacancies in the oxide semiconductor can be reduced.

One embodiment of the present invention includes a transistor including an oxide, a first barrier layer over the transistor, and a second barrier layer in contact with the first barrier layer. The oxide is in contact with an insulator including an excess-oxygen region. The insulator is in contact with the first barrier layer. The first barrier layer has a thickness greater than or equal to 0.5 nm and less than or equal to 1.5 nm. The second barrier layer is thicker than the first barrier layer.

In the above structure, the second barrier layer has a thickness greater than or equal to 3 nm.

In the above structure, the insulator serves as a gate insulator.

In the above structure, the insulator serves as an interlayer insulator.

One embodiment of the present invention includes the step of forming a transistor including an insulator and an oxide, and the step of forming a first barrier layer over the transistor by an ALD method to a thickness greater than or equal to 0.5 nm and less than or equal to 1.5 nm, and then forming a second barrier layer over the first barrier layer by a sputtering method to a thickness greater than that of the first barrier layer, so that an excess-oxygen region is formed in the insulator.

In the above structure, the second barrier layer has a thickness greater than or equal to 3 nm.

In the above structure, the insulator serves as a gate insulator.

In the above structure, the insulator serves as an interlayer insulator.

According to one embodiment of the present invention, a semiconductor device that includes a transistor including an oxide semiconductor and having stable electrical characteristics can be provided.

According to one embodiment of the present invention, a semiconductor device having favorable electrical characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device that can be manufactured with high productivity can be provided.

According to one embodiment of the present invention, a semiconductor device capable of retaining data for a long time can be provided. According to one embodiment of the present invention, a semiconductor device capable of high-speed data writing can be provided. According to one embodiment of the present invention, a semiconductor device having a high degree of design flexibility can be provided. According to one embodiment of the present invention, a low-power semiconductor device can be provided. According to one embodiment of the present invention, a novel semiconductor device can be provided.

Note that the description of these effects does not disturb the existence of other effects. One embodiment of the present invention does not necessarily achieve all the effects. Other effects will be apparent from and can be derived from the description of the specification, the drawings, the claims, and the like.

BEST MODE FOR CARRYING OUT THE INVENTION

Figure 1A:
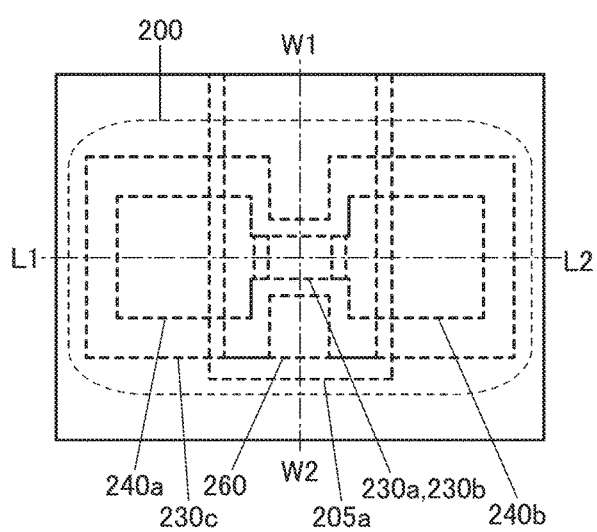
FIGS. 1A to 1C are a top view and cross-sectional views illustrating a structure of a semiconductor device of one embodiment of the present invention.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views illustrating ideal examples, and embodiments of the present invention are not limited to shapes or values illustrated in the drawings. In the drawings, the same portions or portions having similar functions are denoted by the same reference numerals in different drawings, and explanation thereof will not be repeated. Furthermore, the same hatching pattern is applied to portions having similar functions, and the portions are not denoted by reference numerals in some cases.

Note that the ordinal numbers such as first and second in this specification and the like are used for convenience and do not denote the order of steps or the stacking order of layers. Therefore, for example, description can be made even when "first" is replaced with "second" or "third," as appropriate. In addition, the ordinal numbers in this specification and the like are not necessarily the same as those which specify one embodiment of the present invention.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode) and current can flow between the drain and the source through the channel formation region. Note that in this specification and the like, a channel formation region refers to a region through which current mainly flows.

Functions of a source and a drain are sometimes interchanged with each other when a transistor of opposite polarity is used or when the direction of current flow is changed in circuit operation, for example. Therefore, the terms "source" and "drain" can be interchanged with each other in this specification and the like.

Note that the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter also referred to as an "effective channel width") is different from a channel width shown in a top view of a transistor (hereinafter also referred to as an "apparent channel width") in some cases. For example, in a transistor having a gate electrode covering side surfaces of a semiconductor, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where the field-effect mobility, the current value per channel width, and the like of a transistor are obtained by calculation, a surrounded channel width may be used for the calculation. In that case, the values may be different from those calculated using an effective channel width in some cases.

In this specification and the like, the term "electrically connected" includes the case where components are connected through an "object having any electric function." There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, a barrier film refers to a film having a function of inhibiting the passage of oxygen and impurities such as hydrogen. The barrier film that has conductivity may be referred to as a conductive barrier film.

In this specification and the like, a transistor having normally-on characteristics is a transistor that is on when no potential (0 V) is applied by a power source. For example, the normally-on characteristics of a transistor mean, in some cases, electrical characteristics in which the threshold voltage of the transistor becomes negative when a voltage applied to a gate of the transistor ($V_g$) is 0 V.

In this specification and the like, an oxide semiconductor is a type of metal oxide. A metal oxide means an oxide including a metal element. A metal oxide exhibits insulating properties, semiconductor properties, or conductivities depending on its composition or formation method. A metal oxide exhibiting semiconductor properties is referred to as a metal oxide semiconductor or an oxide semiconductor (or simply OS). A metal oxide exhibiting insulating properties is referred to as a metal oxide insulator or an oxide insulator. A metal oxide exhibiting conductivities is referred to as a metal oxide conductor or an oxide conductor. In other words, a metal oxide used in a channel formation region or the like of a transistor can be referred to as an oxide semiconductor.

Embodiment 1

Figure 1C:
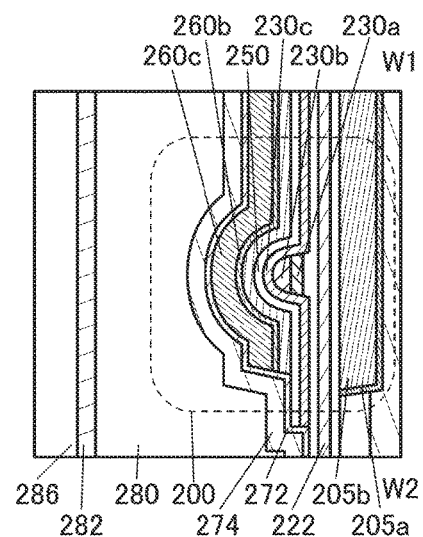
Figure 1B:
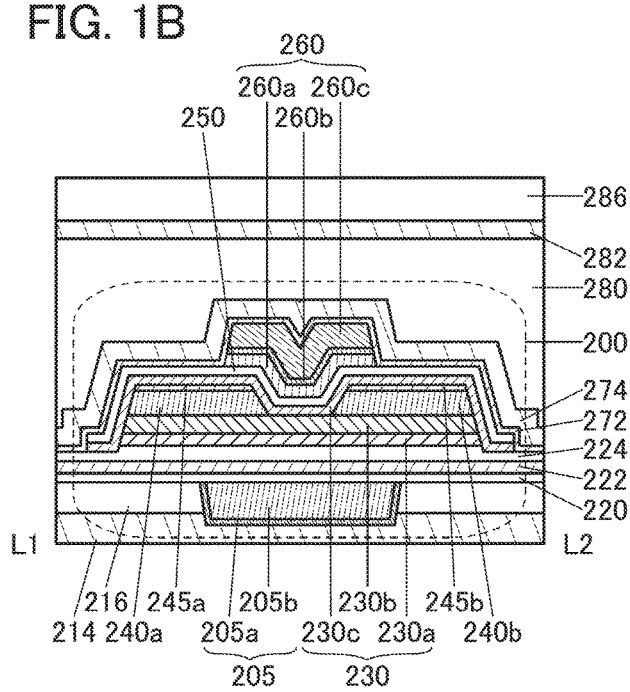

In this embodiment, one mode of a semiconductor device will be described with reference to FIG. 1A to FIG. 5F.
<Structure of Transistor: 1>
An example of a semiconductor device including a transistor 200 of one embodiment of the present invention is described below. FIGS. 1A to 1C are a top view and cross-sectional views illustrating the transistor 200 of one embodiment of the present invention and the periphery thereof. FIG. 1A is the top view, FIG. 1B is the cross-sectional view taken along dashed-dotted line L1-L2 in FIG. 1A, and FIG. 1C is the cross-sectional view taken along dashed-dotted line W1-W2 in FIG. 1A. For simplification of the drawing, some components are not illustrated in the top view in FIG. 1A.

The semiconductor device of one embodiment of the present invention includes the transistor 200 and insulators 214, 216, 280, 282, and 286 that serve as interlayer films.

The transistor 200 includes a conductor 205 (conductors 205a and 205b) serving as a first gate electrode, a conductor 260 (conductors 260a, 260b, and 260c) serving as a second gate electrode, insulators 220, 222, and 224 serving as a first gate insulating layer, an insulator 250 serving as a second gate insulating film, an oxide 230 (oxides 230a, 230b, and 230c) including a region where a channel is formed, a conductor 240a serving as one of a source and a drain, a conductor 240b serving as the other of the source and the drain, barrier layers 245a and 245b in contact with a conductor 240 (the conductors 240a and 240b are collectively referred to as the conductor 240 in some cases), an insulator 272 in contact with the insulators 250 and 224, and an insulator 274 over the insulator 272.

In the transistor 200, the oxide 230 is preferably formed using a metal oxide functioning as an oxide semiconductor (hereinafter, the metal oxide is also referred to as an oxide semiconductor). A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes an oxygen vacancy, in some cases. The entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible.

In view of the above, an insulator containing oxygen is used as the insulators 224 and 250 that are in contact with the oxide 230. It is particularly preferable that the insulators 224 and 250 be formed using an oxide containing oxygen at a proportion higher than that in the stoichiometric composition. That is, the insulators 224 and 250 each preferably have a region containing oxygen in excess of that in the stoichiometric composition (hereinafter also referred to as an excess-oxygen region). When an insulator having an excess-oxygen region is provided as the insulators 224 and 250 in contact with the oxide 230, oxygen vacancies in the oxide 230 included in the transistor 200 can be reduced, leading to an improvement in reliability.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

Furthermore, in order that oxygen in the excess-oxygen regions of the insulators 224 and 250 can be efficiently supplied to the oxide 230, the insulators 272 and 274 are provided over the insulators 224 and 250. That is, the insulators 272 and 274 have a barrier property against oxygen; as a result, oxygen in the excess-oxygen regions is not diffused outside the transistor 200 but supplied to the oxide 230 efficiently.

The barrier property here refers to a function of inhibiting the diffusion of impurities typified by hydrogen and water, oxygen, and the like.

Note that the insulators 272 and 274 preferably inhibit the diffusion of hydrogen in an atmosphere at 350° C., preferably at 400° C. For example, in a structure including a first film that releases hydrogen and any second film stacked thereover, the second film is regarded as having a barrier property against hydrogen in the case where the amount of released hydrogen in TDS measurement is less than or equal to $5.0 \times 10^{14}$ atoms/cm$^2$ at a temperature lower than or equal to 400° C. The amount of released hydrogen is preferably less than or equal to $3.4 \times 10^{14}$ atoms/cm$^2$ at a temperature lower than or equal to 400° C., further preferably less than or equal to $7.1 \times 10^{14}$ atoms/cm$^2$ at a temperature lower than or equal to 500° C., and still further preferably less than or equal to $1.4 \times 10^{15}$ atoms/cm$^2$ at a temperature lower than or equal to 600° C.

The structure of the semiconductor device including the transistor 200 of one embodiment of the present invention will be described in detail below.

The conductor 205 serving as the first gate electrode is formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. In particular, a metal nitride film such as a tantalum nitride film is preferable because it has a barrier property against hydrogen or oxygen and is difficult to oxidize (has a high oxidation resistance). Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable that a conductor having a barrier property against hydrogen, e.g., tantalum nitride, be used as the conductor 205a, and tungsten, which has high conductivity, be stacked thereover as the conductor 205b. The use of the combination of the materials can prevent the diffusion of hydrogen to the oxide 230 while the conductivity of a wiring is ensured. Note that a two-layer structure of the conductors 205a and 205b is illustrated in FIGS. 1A to 1C; however, one embodiment of the present invention is not limited thereto, and a single-layer structure or a stacked-layer structure of three or more layers may be used. For example, between a conductor having a barrier property and a conductor having high conductivity, a conductor which is highly adhesive to the conductor having a barrier property and the conductor having high conductivity may be formed.

The insulators 220, 222, and 224 have a function of a first gate insulator.

The insulators 222 and 224 can have a single-layer structure or a stacked-layer structure using an insulator containing, for example, silicon oxide, silicon oxynitride, or silicon nitride oxide. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator. Note that in this specification, "silicon oxynitride" refers to a material that contains oxygen at a higher proportion than nitrogen, and "silicon nitride oxide" refers to a material that contains nitrogen at a higher proportion than oxygen.

Because silicon oxide and silicon oxynitride have thermal stability, combination of silicon oxide or silicon oxynitride with an insulator with a high relative permittivity allows the stacked-layer structure to be thermally stable and have a high relative permittivity, for example.

In particular, as the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced, leading to an improvement in reliability.

When the insulator 224 includes an excess-oxygen region, the insulator 222 preferably has a barrier property against oxygen, hydrogen, and water. When the insulator 222 has a barrier property against oxygen, oxygen in the excess-oxygen region is not diffused to the insulator 220 side but supplied to the oxide 230 efficiently. Furthermore, the conductor 205 can be inhibited from reacting with oxygen in the excess-oxygen region of the insulator 224.

The insulator 222 preferably has a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST). In particular, an insulating film having a barrier property against oxygen or hydrogen, e.g., an aluminum oxide film or a hafnium oxide film, is preferably used. The insulator 222 formed of such a material serves as a layer that prevents release of oxygen from the oxide 230 and entry of an impurity such as hydrogen from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Note that the insulators 220, 222, and 224 each may have a stacked-layer structure of two or more layers. In that case, the stacked layers are not necessarily formed of the same material but may be formed of different materials.

Since the insulator 222 containing a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulators 220 and 224 are formed using silicon oxide and the insulator 222 is formed using a material having many electron trap states such as hafnium oxide, aluminum oxide, or tantalum oxide, the state where the potential of the conductor 205 is higher than the potential of the source electrode or the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states in the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

Furthermore, the treatment for trapping the electrons may be performed in the manufacturing process of the transistor. For example, the treatment is preferably performed at any step before factory shipment, such as after the formation of a conductor connected to the source conductor or the drain conductor of the transistor, after pretreatment (wafer processing), after a wafer-dicing step, and after packaging.

The threshold voltage can be controlled by appropriate adjustment of the thicknesses of the insulators 220, 222, and 224. For example, when the total thickness of the insulators 220, 222, and 224 is small, a voltage is efficiently applied from the conductor 205, resulting in low power consumption of the transistor. The total thickness of the insulators 220, 222, and 224 is less than or equal to 65 nm, preferably less than or equal to 20 nm.

Thus, a transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The oxide 230 includes the oxide 230a, the oxide 230b over the oxide 230a, and the oxide 230c over the oxide 230b. When the transistor 200 is turned on, current flows (a channel is formed) mainly in the oxide 230b. In contrast, although current might flow through a region in the vicinity of the interface (a mixed region in some cases) between the oxide 230b and the oxide 230a or 230c, the other regions of the oxides 230a and 230c might serve as insulators.

As illustrated in FIG. 1C, the oxide 230c is preferably provided to cover side surfaces of the oxides 230a and 230b. The oxide 230c, which is provided between the insulator 280 and the oxide 230b including the region where the channel is formed, can prevent impurities such as hydrogen, water, and halogen from diffusing from the insulator 280 to the oxide 230b.

The oxides 230a, 230b, and 230c are formed using a metal oxide such as an In-M-Zn oxide (an element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like). An In—Ga oxide or an In—Zn oxide may be used for the oxide 230.

<<Metal Oxide>>

The oxide 230 of the present invention will be described below. The oxide 230 is preferably formed using a metal oxide functioning as an oxide semiconductor (hereinafter, the metal oxide is also referred to as an oxide semiconductor).

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is InMZnO containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

In this specification and the like, a metal oxide including nitrogen is also called a metal oxide in some cases. Moreover, a metal oxide including nitrogen may be called a metal oxynitride.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, CAC-OS or CAC-metal oxide can be called a matrix composite or a metal matrix composite.

[Structure of Metal Oxide]

Oxide semiconductors can be classified into a single crystal oxide semiconductor and a non-single-crystal oxide semiconductor. Examples of the non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

The CAAC-OS is an oxide semiconductor with high crystallinity. In contrast, in the CAAC-OS, a reduction in the electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<<Transistor Including Oxide Semiconductor>>

Next, the case where the oxide semiconductor is used for a transistor will be described.

Note that when the oxide semiconductor is used for a transistor, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, the transistor whose channel formation region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<<Impurities>>

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

One of the conductors 240a and 240b serves as a source electrode, and the other thereof serves as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. In particular, a metal nitride film such as a tantalum nitride film is preferable because it has a barrier property against hydrogen or oxygen and has a high oxidation resistance.

Although a single-layer structure is illustrated in the drawings, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Furthermore, the barrier layers 245a and 245b may be provided over the conductors 240a and 240b. A material having a barrier property against oxygen or hydrogen is preferably used for the barrier layers 245a and 245b. With this structure, the conductor 240a and the conductor 240b can be inhibited from being oxidized when the oxide 230c is deposited. Oxygen in the excess-oxygen region in the insulator 280 can be prevented from reacting with the conductor 240a and the conductor 240b and from oxidizing them.

A metal oxide can be used for the barrier layers 245a and 245b, for example. In particular, an insulating film having a barrier property against oxygen or hydrogen, e.g., an aluminum oxide film, a hafnium oxide film, or a gallium oxide film, is preferably used. Alternatively, silicon nitride deposited by a CVD method may be used.

With the use of the barrier layers 245a and 245b, the range of choices for the materials of the conductors 240 can be expanded. For the conductors 240, for example, a material having low oxidation resistance and high conductivity, such as tungsten or aluminum, or a conductor that can be easily deposited and processed can be used.

In addition, the oxidation of the conductors 240 can be prevented, and oxygen released from the insulators 224 and 280 can be supplied to the oxide 230 efficiently. Furthermore, a conductor that has high conductivity is used for the conductors 240, whereby the transistor 200 with low power consumption can be provided.

The insulator 250 serving as a second gate insulator can have a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Because silicon oxide and silicon oxynitride have thermal stability, combination of silicon oxide or silicon oxynitride with an insulator with a high relative permittivity allows the stacked-layer structure to be thermally stable and have a high relative permittivity, for example.

As the insulator 250, like the insulator 224, an oxide insulator that contains more oxygen than that in the stoichiometric composition is preferably used. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator 250 formed of such a material serves as a layer that prevents release of oxygen from the oxide 230 and entry of an impurity such as hydrogen from the outside.

Note that the insulator 250 may have a stacked-layer structure similar to that of the insulators 220, 222, and 224. When the insulator 250 includes an insulator in which a necessary amount of electrons is trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

The conductor 260 serving as a second gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property against hydrogen or oxygen and has a high oxidation resistance. Furthermore, one or both of manganese and zirconium may be used. Alternatively, a semiconductor typified by polycrystalline silicon doped with an impurity element such as phosphorus, or a silicide such as nickel silicide may be used.

For example, the conductor 260a can be formed using an oxide typified by an In—Ga—Zn oxide. An oxide semiconductor typified by an In—Ga—Zn oxide has an increased carrier density by being supplied with nitrogen or hydrogen. In other words, the oxide semiconductor functions as an oxide conductor (OC). When a metal nitride is provided as the conductor 260b, the oxide semiconductor has a higher carrier density and thus, the conductor 260a serves as a gate electrode.

The conductor 260a can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO).

The conductor 260a is preferably formed by a sputtering method in an atmosphere containing an oxygen gas. In the case where the conductor 260a is formed in an atmosphere containing an oxygen gas, an excess-oxygen region can be formed in the insulator 250. Note that a method for forming the conductor 260a is not limited to a sputtering method, and other methods such as an ALD method may be used.

The use of a metal nitride for the conductor 260b produces the following effects: the resistance of the conductor 260a is reduced by the diffusion of the constituent element (especially, nitrogen) of the metal nitride to the conductor 260a; and the resistance is reduced by damage (e.g., sputtering damage) caused during the deposition of the conductor 260b. Furthermore, when a low-resistance metal film is stacked as the conductor 260c, a transistor with a low driving voltage can be provided.

The insulators 272 and 274 are provided to cover the insulators 224 and 250 and the conductor 260.

When the insulators 224 and 250 each include an excess-oxygen region, the stack of the insulators 272 and 274 preferably has a barrier property against oxygen, hydrogen, and water. When the stack of the insulators 272 and 274 has a barrier property against oxygen, oxygen in the excess-oxygen region is not diffused outside the transistor 200 but supplied to the oxide 230 efficiently.

When the stack of the insulators 272 and 274 has a barrier property against hydrogen and water, hydrogen and water outside the transistor 200 are not diffused into the transistor 200, and generation of oxygen vacancies in the oxide 230 can be inhibited.

The insulators 272 and 274 each preferably have a single-layer structure or a stacked-layer structure using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), ($Ba,Sr)TiO_3$ (BST), or the like. In particular, an insulating film having a barrier property against oxygen or hydrogen, e.g., an aluminum oxide film or a hafnium oxide film, is preferably used. The insulators 272 and 274 formed of such a material serve as a layer that prevents release of oxygen from the oxide 230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the above insulators, for example. Alternatively, the insulators may be subjected to nitriding treatment. Silicon oxide, silicon oxynitride, or silicon nitride may be stacked over the above insulators.

For example, as the insulator 272, a dense film with good coverage is preferably formed to a thickness less than or equal to 3 nm, preferably greater than or equal to 0.5 nm and less than or equal to 1.5 nm. An example of the dense film with good coverage is an aluminum oxide film that is formed by an atomic layer deposition (ALD) method. The ALD method allows forming of the dense insulator 272 that has reduced defects such as cracks and pinholes or has a uniform thickness. In addition, the ALD method causes less damage on an object under a film to be formed than a sputtering method, which enables the interface between the insulators 250 and 272 to be maintained properly.

The insulator 274 is preferably, for example, an oxide insulator that has a thickness greater than or equal to 3 nm and has a barrier property against oxygen, hydrogen, and water. For example, an aluminum oxide film formed by a sputtering method can be used as the insulator 274. In that case, since the sputtering method achieves a higher deposition rate than the ALD method, the insulator 274 with a thickness greater than 3 nm, which is thick enough to ensure a barrier property against oxygen, hydrogen, and water, can be formed with high yield.

When the insulator 274 having a barrier property is stacked over the dense insulator 272 with good coverage, an insulator having a high barrier property can be obtained. The insulators 272 and 274 are preferably formed with the same type of material, in which case processing in later steps is facilitated. For example, in the case where an opening is formed to reach the conductor 240, 260, or the like, the opening can be formed in the insulators 272 and 274 under the same processing conditions.

Furthermore, when an aluminum oxide film formed by a sputtering method is stacked over an aluminum oxide film formed by an ALD method, a highly reliable stack can be obtained with high productivity.

The insulators 214, 216, 280, 282, and 286 serving as interlayer films can have a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and ($Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulators.

Because silicon oxide and silicon oxynitride have thermal stability, combination of silicon oxide or silicon oxynitride with an insulator with a high relative permittivity allows the stacked-layer structure to be thermally stable and have a high relative permittivity, for example.

For example, the insulators 216, 280, and 286 preferably have a lower permittivity than the insulator 214 or 282. In the case where a material with a low permittivity is used for an interlayer film, the parasitic capacitance between wirings can be reduced.

The insulators 214 and 282 each preferably have a single-layer structure or a stacked-layer structure using an insulator containing what is called a high-k material such as silicon nitride oxide, aluminum oxide, hafnium oxide, tantalum oxide, zirconium oxide, lead zirconate titanate (PZT), strontium titanate ($SrTiO_3$), or ($Ba,Sr)TiO_3$ (BST). In particular, an insulating film having a barrier property against oxygen or hydrogen, e.g., an aluminum oxide film or a hafnium oxide film, is preferably used. The insulators formed of such a material each serve as a layer that prevents release of oxygen from the oxide 230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the insulators 214, 216, 280, 282, and 286, for example. Alternatively, the insulators may be subjected to nitriding treatment. Silicon oxide, silicon oxynitride, or silicon nitride may be stacked over the above insulators.

The insulators 214, 216, 280, 282, and 286 each may have a stacked-layer structure of two or more layers. In that case, the stacked layers are not necessarily formed of the same material but may be formed of different materials. Note that the insulator 280 that covers the transistor 200 may function as a planarization film that covers a roughness thereunder.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has small variation in electrical characteristics, i.e., stable electrical characteristics, and has high reliability can be provided. Alternatively, a semiconductor device with reduced power consumption can be provided.

<Method for Manufacturing Semiconductor Device>

An example of a method for manufacturing a semiconductor device including the transistor 200 illustrated in FIGS. 1A to 1C will be described below with reference to FIG. 2A to FIG. 5F. In the drawings, cross-sectional views along L1-L2 are cross-sectional views of the transistor 200 in the channel length direction, and cross-sectional views along W1-W2 are cross-sectional views of the transistor 200 in the channel width direction.

First, a substrate is prepared (not illustrated). Although there is no particular limitation on the substrate, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide; a silicon-on-insulator (SOI) substrate; a germanium-on-insulator (GOI) substrate; or the like can be used. Further alternatively, any of these substrates provided with a semiconductor element may be used as the substrate.

Further alternatively, a flexible substrate may be used as the substrate to manufacture the semiconductor device. To manufacture a flexible semiconductor device, a transistor may be directly formed over a flexible substrate; alternatively, a transistor may be formed over a manufacturing substrate and then separated from the manufacturing substrate and transferred to a flexible substrate. In order that the transistor be separated from the manufacturing substrate to be transferred to the flexible substrate, it is preferable to provide a separation layer between the manufacturing substrate and the transistor including an oxide semiconductor.

Figure 2A:
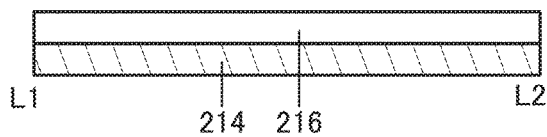
FIGS. 2A to 2J are cross-sectional views illustrating a method for manufacturing a semiconductor device of one embodiment of the present invention.
Figure 2B:
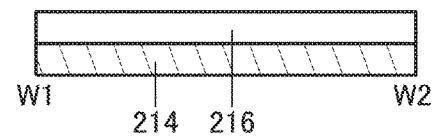

Next, the insulators 214 and 216 are formed (FIGS. 2A and 2B).

The insulators 214 and 216 can be formed using a sputtering method, a CVD method (including a thermal CVD method, a metal organic CVD (MOCVD) method, a plasma-enhanced CVD (PECVD) method, and the like), a molecular beam epitaxy (MBE) method, an ALD method, a pulsed laser deposition (PLD) method, or the like. In particular, it is preferable that the insulators be deposited by a CVD method, further preferably an ALD method or the like, because coverage can be further improved. It is preferable to use a thermal CVD method, an MOCVD method, or an ALD method in order to reduce plasma damage. The insulators can also be formed using a silicon oxide film capable of providing high step coverage that is formed by reacting tetraethyl orthosilicate (TEOS), silane, or the like with oxygen, nitrous oxide, or the like.

As the insulator 214, an aluminum oxide film is formed by a sputtering method, for example. Since the sputtering method achieves a higher deposition rate than the ALD method, the productivity can be improved. As the insulator 216, a silicon oxynitride film is formed by a CVD method, for example. The insulator 216 preferably has a lower permittivity than the insulator 214. In the case where a material with a low permittivity is used for an interlayer film, the parasitic capacitance between wirings can be reduced.

Figure 2C:
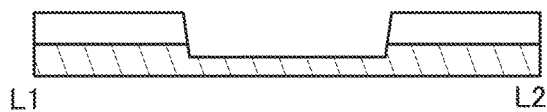
Figure 2D:
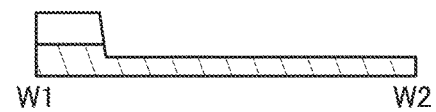

Subsequently, a resist mask is formed over the insulator 216 by a lithography method or the like, and unnecessary portions of the insulators 214 and 216 are removed. After that, the resist mask is removed; thus, an opening can be formed (FIGS. 2C and 2D).

Here, a method for processing a film is described. To process a film finely, a variety of fine processing techniques can be used. For example, it is possible to use a method in which a resist mask formed by a lithography process or the like is subjected to slimming treatment. Alternatively, a dummy pattern is formed by a lithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use extreme ultra-violet (EUV) light, X-rays, or an electron beam because extremely minute processing can be performed. Note that in the case of performing exposure by scanning with a beam such as an electron beam, a photomask is not needed.

An organic resin film having a function of improving the adhesion between a film and a resist film may be formed before the resist film serving as a resist mask is formed. The organic resin film can be formed to provide a flat surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the resist mask or after the resist mask is removed.

Figure 2E:
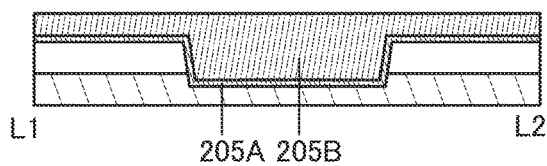
Figure 2F:
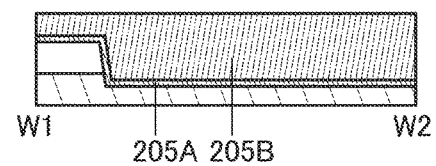
Figure 2G:
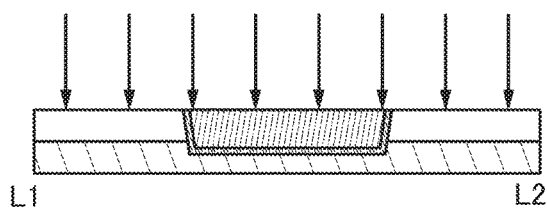
Figure 2H:
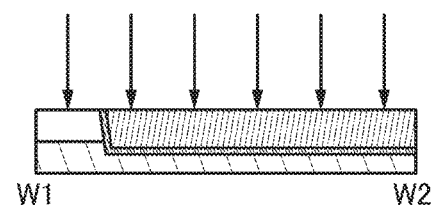
Figure 2I:
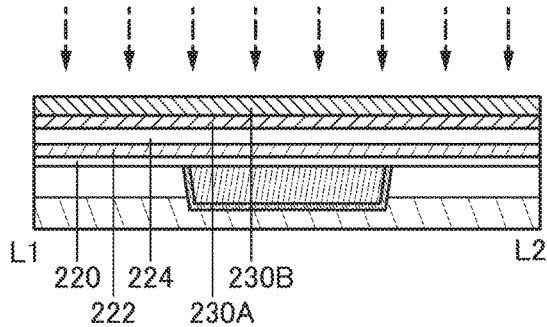
Figure 2J:
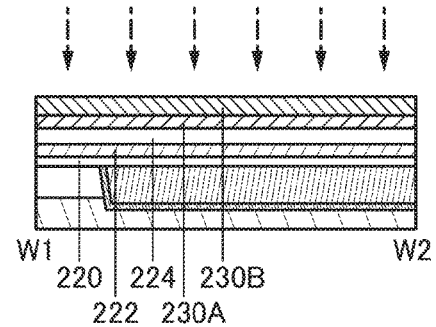

Next, a conductive film 205A and a conductive film 205B are formed over the insulators 214 and 216 (FIGS. 2E and 2F). The conductive films 205A and 205B can be formed by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage.

Then, unnecessary portions of the conductive films 205A and 205B are removed. For example, part of the conductive film 205A and part of the conductive film 205B are removed by etch-back processing, chemical mechanical polishing (CMP) processing, or the like until the insulator 216 is exposed, whereby the conductors 205a and 205b are formed (FIGS. 2G and 2H, where arrows show the CMP processing). At this time, the insulator 216 can be used as a stopper layer, and the thickness of the insulator 216 is reduced in some cases.

The CMP processing is processing for planarizing a surface of an object to be processed by a combination of chemical and mechanical actions. More specifically, in the CMP processing, a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP processing may be performed only once or a plurality of times. When the CMP processing is performed a plurality of times, it is preferable that first polishing be performed at a high polishing rate and final polishing be performed at a low polishing rate. In this manner, polishing processes using different polishing rates may be used in combination.

Then, the insulators 220, 222, and 224 are formed. Note that the insulators 220 and 222 are not necessarily provided. For example, when the insulator 224 has an excess-oxygen region, a conductor having a barrier property against oxygen, hydrogen, and water may be formed over the conductor 205. The conductor having a barrier property against oxygen, hydrogen, and water can inhibit the conductor 205 from reacting with oxygen in the excess-oxygen region and from generating an oxide.

The insulators 220, 222, and 224 can be formed using materials and methods similar to those used for forming the insulators 214 and 216. It is particularly preferable to use a high-k material such as hafnium oxide and aluminum oxide for the insulator 222.

The insulators 220, 222, and 224 are preferably deposited successively. By successive deposition, impurities do not attach to the interfaces between the insulators 220 and 222 and between the insulators 222 and 224, resulting in high reliability of the insulators.

Next, an oxide film 230A to be the oxide 230a, and an oxide film 230B to be the oxide 230b are sequentially formed. It is preferable that the oxide films be successively formed without exposure to the air.

For example, as the insulator 222, an aluminum oxide film is formed by an ALD method. The ALD method allows forming of a dense insulating layer that has reduced defects such as cracks and pinholes or has a uniform thickness.

For example, as each of the insulators 220 and 224, a silicon oxynitride film is formed by a CVD method. In particular, the insulator 224 is preferably an insulating layer containing excess oxygen. After the formation of the insulator 224, oxygen doping treatment may be performed so that an excess-oxygen region can be formed in the insulator 224.

Next, heat treatment is preferably performed to further reduce impurities such as moisture and hydrogen contained in the insulator 224.

Plasma treatment using an oxidizing gas may be performed before the heat treatment. For example, plasma treatment using a nitrous oxide gas is performed. By the plasma treatment, the concentration of fluorine in the exposed insulating layer can be lowered. Moreover, the plasma treatment is effective in removing an organic substance on the surface of a sample.

For example, the heat treatment is performed in an inert atmosphere containing nitrogen, a rare gas, or the like, an oxidizing gas atmosphere, or an ultra-dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert atmosphere refers to an atmosphere which contains the oxidizing gas at lower than 10 ppm and is filled with nitrogen or a rare gas. Although there is no particular limitation on the pressure during the heat treatment, the heat treatment is preferably performed under a reduced pressure.

Note that the heat treatment may be performed in such a manner that heat treatment is performed in an inert atmosphere, and then another heat treatment is performed in an atmosphere containing an oxidizing gas at 10 ppm or more, 1% or more, or 10% or more in order to compensate for desorbed oxygen. The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

After heat treatment is performed at 400° C. in a nitrogen gas atmosphere for one hour, another heat treatment is preferably performed at 400° C. in an oxygen gas atmosphere for one hour, for example. By performing the heat treatment in a nitrogen gas atmosphere first, impurities such as moisture or hydrogen contained in the insulator 224 are released, so that the impurity concentration in the insulator 224 is reduced. By performing the heat treatment in an oxygen gas atmosphere next, oxygen is introduced into the insulator 224.

Next, the oxide film 230A, the oxide film 230B, a conductive film 240A, and a barrier film 245A are sequentially formed.

For example, the oxide films 230A and 230B are formed by a sputtering method. Oxygen or a mixed gas of oxygen and a rare gas is used as a sputtering gas. By increasing the proportion of oxygen in the sputtering gas, the amount of excess oxygen in the oxide film to be deposited can be increased.

In particular, part of oxygen contained in the sputtering gas is supplied to the insulator 224 in some cases, at the formation of the oxide film 230A.

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference ($E_2 - E_0$) and collide with the target; accordingly, sputtered particles are ejected from the target. These sputtered particles are attached to a deposition surface and deposited thereover; as a result, a film is formed. Some ions recoil by the target and might be taken, as recoil ions, into the insulator 224 positioned below the formed film, through the formed film. The ions in the plasma are accelerated by a potential difference ($E_2 - E_1$) and collide with the deposition surface. At that time, some ions reach the inside of the insulator 224. The ions are taken into the insulator 224; accordingly, a region into which the ions are taken is formed in the insulator 224. That is, an excess-oxygen region is formed in the insulator 224 in the case where the ions include oxygen.

Introduction of excess oxygen to the insulator 224 can form an excess-oxygen region. The excess oxygen in the insulator 224 is supplied to the oxide 230 and can fill oxygen vacancies in the oxide 230.

Hence, a region containing excess oxygen can be formed in the insulator 224 at the same time as the formation of the oxide film 230A. As the amount of oxygen contained in the sputtering gas increases, the amount of oxygen supplied to the insulator 224 increases. Part of oxygen supplied to the insulator 224 reacts with hydrogen left in the insulator 224 to produce water and is released from the insulator 224 by later heat treatment. Thus, the hydrogen concentration in the insulator 224 can be reduced.

Note that the proportion of oxygen in the sputtering gas is preferably 70% or higher, further preferably 80% or higher, and still further preferably 100%. When an oxide containing excess oxygen is used for the oxide film 230A, oxygen can be supplied to the oxide 230b by later heat treatment.

Then, the oxide film 230B is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have a relatively high field-effect mobility.

In the case where an oxygen-deficient oxide semiconductor is used for the oxide film 230B, an oxide film containing excess oxygen is preferably used as the oxide film 230A. Oxygen doping treatment may be performed after the formation of the oxide film 230B.

Next, heat treatment is preferably performed to further reduce impurities such as moisture and hydrogen contained in the oxide film 230A and the oxide film 230B to highly purify the oxide film 230A and the oxide film 230B.

By the heat treatment, at the same time that the impurities are released from the oxide films 230A and 230B, oxygen contained in the insulator 224 is diffused to the oxide films 230A and 230B and oxygen vacancies in the oxide films can be reduced.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

For example, after heat treatment is performed at 400° C. in a nitrogen gas atmosphere for one hour, another heat treatment is preferably performed at 400° C. in an oxygen gas atmosphere for one hour. By performing the heat treatment in a nitrogen gas atmosphere first, impurities such as moisture or hydrogen contained in the oxide films 230A and 230B are released, so that the impurity concentration in the oxide films 230A and 230B is reduced. By performing the heat treatment in an oxygen gas atmosphere next, oxygen is introduced into the oxide films 230A and 230B.

Plasma treatment using an oxidizing gas may be performed before the heat treatment. For example, plasma treatment using a nitrous oxide gas is performed. By the plasma treatment, the concentration of fluorine in the exposed insulating layer can be lowered. Moreover, the plasma treatment is effective in removing an organic substance on the surface of a sample.

Figure 3A:
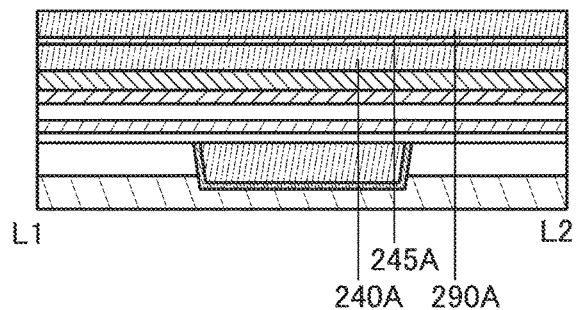
FIGS. 3A to 3H are cross-sectional views illustrating a method for manufacturing a semiconductor device of one embodiment of the present invention.
Figure 3B:
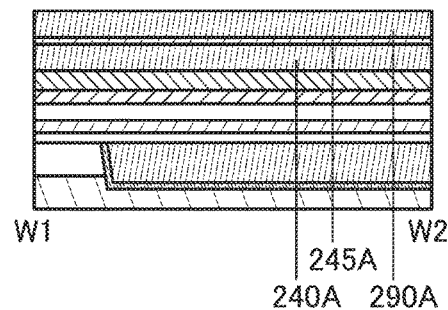

Next, the conductive film 240A, the barrier film 245A, and a film 290A to be a hard mask are formed (FIGS. 3A and 3B).

For example, a tantalum nitride film is formed as the conductive film 240A by a sputtering method. Tantalum nitride has high oxidation resistance and thus is preferably used in the case where heat treatment is performed in a later step.

When the conductive film 240A is in contact with the oxide film 230B, impurity elements are introduced to the surface of the oxide film 230B in some cases. Introduction of the impurities into the oxide film 230B can change the threshold voltage of the transistor 200. The impurity element may be introduced by an ion implantation method, an ion doping method, a plasma immersion ion implantation method, plasma treatment using a gas containing the impurity element, or the like before the conductive film 240A is formed. Alternatively, the impurity element may be introduced by an ion implantation method or the like after the conductive film 240A is formed.

As the barrier film 245A, an aluminum oxide film is preferably formed by an ALD method, for example. The ALD method allows forming of a dense film that has reduced defects such as cracks and pinholes or has a uniform thickness.

As the film 290A to be a hard mask, a tantalum nitride film is formed by a sputtering method, for example. The hard mask is processed at the same time as the conductive film 240A in a later step and thus is preferably formed using the same material as the conductive film 240A or a material whose etching rate is closer to that of the conductive film 240A.

Figure 3C:
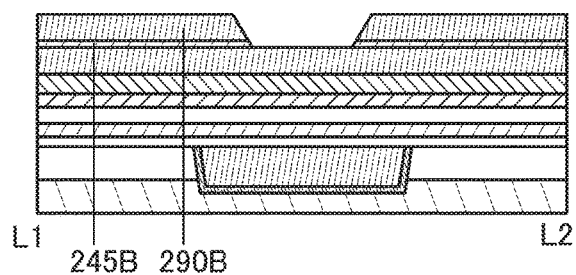
Figure 3D:
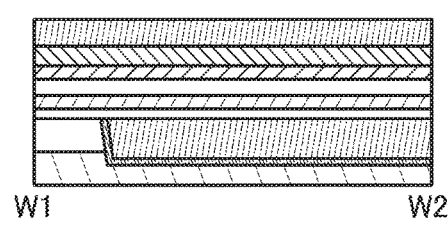

Then, a resist mask is formed over the film 290A to be a hard mask by a photolithography method. Part of the film 290A to be a hard mask and part of the barrier film 245A are selectively removed using the resist mask, so that a film 290B to be a hard mask having an opening and a barrier film 245B having an opening are formed (FIGS. 3C and 3D). The formation of the openings using the resist mask is preferably performed using the minimum feature size. Accordingly, the barrier film 245B has an opening whose width is the minimum feature size.

Note that at the time of the formation of the openings, side surfaces of the film 290B to be a hard mask and the barrier film 245B in the openings are preferably tapered to the top surface of the conductive film 240A. Note that the taper angle is 30° or more and 90° or less, preferably 45° or more and 80° or less.

Figure 3E:
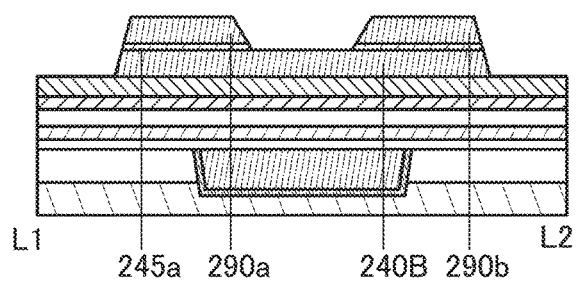
Figure 3F:
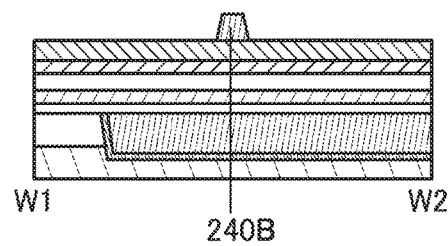

Next, a resist mask is formed over the film 290B to be a hard mask and the barrier film 245B by a photolithography method. Part of the film 290B to be a hard mask, part of the barrier film 245B, and part of the conductive film 240A are selectively removed using the resist mask, so that an island-shaped conductive film 240B, a hard mask 290a, a hard mask 290b, and the barrier layers 245a and 245b are formed (FIGS. 3E and 3F). At this time, the barrier film 245B is processed into the barrier layers 245a and 245b. That is, when the width of the opening of the barrier film 245B is the minimum feature size, the distance between the barrier layer 245a and the barrier layer 245b is the minimum feature size.

Figure 3G:
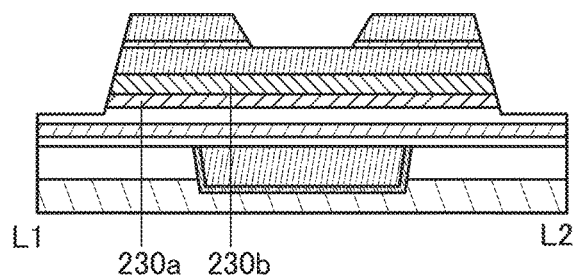
Figure 3H:
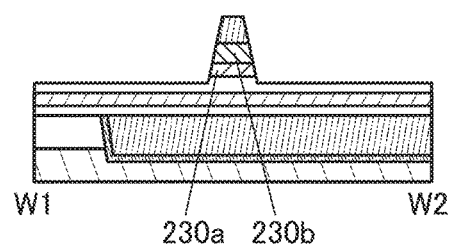

Subsequently, part of the oxide film 230A and part of the oxide film 230B are selectively removed using the island-shaped conductive film 240B, hard mask 290a, and hard mask 290b as masks. In this step, part of the insulator 224 is also removed in some cases. After that, the resist mask is removed. In this manner, the island-shaped oxides 230a and 230b can be formed (FIGS. 3G and 3H).

Figure 4A:
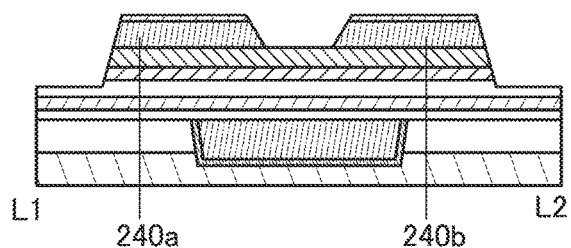
FIGS. 4A to 4H are cross-sectional views illustrating a method for manufacturing a semiconductor device of one embodiment of the present invention.
Figure 4B:
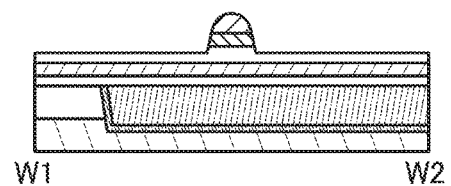

Then, at the same time as the hard masks 290a and 290b, part of the island-shaped conductive film 240B is selectively removed. In this step, the conductive film 240B is separated into the conductor 240a and the conductor 240b (FIGS. 4A and 4B).

The conductors 240a and 240b serve as a source electrode and a drain electrode of the transistor 200; thus, the distance between the conductors 240a and 240b facing each other can be referred to as a channel length of the transistor. That is, when the width of the opening of the barrier film 245B is the minimum feature size, the distance between the barrier layer 245a and 245b is the minimum feature size; thus, the gate line width and the channel length can be smaller than the minimum feature size.

Note that the removal of the portions of the oxide film 230A, the oxide film 230B, the conductive film 240A, and the barrier film 245A can be performed by a dry etching method, a wet etching method, or the like. Both the dry etching method and the wet etching method may be used.

When the conductors 240a and 240b are formed by a dry etching method, an impurity element such as remaining components of an etching gas might be attached to an exposed part of the oxide 230b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurity elements attached to the exposed surface of the oxide 230b are preferably reduced. The impurity elements can be reduced by cleaning treatment using diluted hydrofluoric acid, cleaning treatment using ozone or the like, cleaning treatment using ultraviolet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 230b can be lowered. Moreover, the plasma treatment is effective in removing an organic substance on the surface of a sample.

Oxygen doping treatment may be performed on the exposed oxide 230b.

Figure 4C:
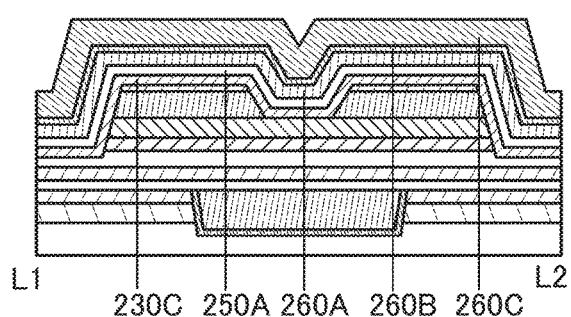
Figure 4D:
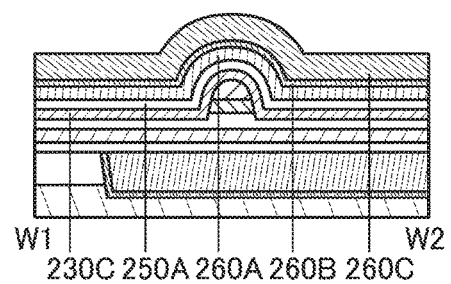

Next, an oxide film 230C, an insulating film 250A, a conductive film 260A, a conductive film 260B, and a conductive film 260C are formed (FIGS. 4C and 4D).

For the oxide film 230C, for example, an oxide containing excess oxygen is used like the oxide 230a. When an oxide containing excess oxygen is used for the oxide film 230C, oxygen can be supplied to the oxide 230b by later heat treatment.

At the formation of the oxide film 230C, part of oxygen contained in the sputtering gas is supplied to the insulator 224, and an excess-oxygen region is formed in some cases, as in the case of the oxide 230a. Part of oxygen supplied to the insulator 224 reacts with hydrogen left in the insulator 224 to produce water and is released from the insulator 224 by later heat treatment. Thus, the hydrogen concentration in the insulator 224 can be reduced.

Oxygen doping treatment and/or heat treatment may be performed after the formation of the oxide film 230C. By the heat treatment, oxygen contained in the oxide 230a and the oxide film 230C can be supplied to the oxide 230b. By supplying oxygen to the oxide 230b, oxygen vacancies in the oxide 230b can be reduced. Thus, in the case where an oxygen-deficient oxide semiconductor is used for the oxide 230b, a semiconductor containing excess oxygen is preferably used for the oxide film 230C.

Part of the oxide film 230C is in contact with the channel formation region of the oxide 230b. Top and side surfaces of the channel formation region of the oxide 230b are covered with the oxide film 230C. In such a manner, the oxide 230b can be surrounded by the oxide 230a and the oxide film 230C. By surrounding the oxide 230b by the oxide 230a and the oxide film 230C, the diffusion of impurities to the oxide 230b which is to be caused in a later step can be suppressed.

For the insulating film 250A, a silicon oxynitride film is formed by a CVD method, for example. The insulating film 250A is preferably an insulating layer containing excess oxygen. The insulating film 250A may be subjected to oxygen doping treatment. Heat treatment may be performed after the formation of the insulating film 250A.

For example, as the conductive film 260A, an In—Ga—Zn oxide film is formed by a sputtering method. As the conductive film 260B, for example, a metal nitride film is formed by a sputtering method.

An oxide semiconductor typified by an In—Ga—Zn oxide has an increased carrier density by being supplied with nitrogen or hydrogen. In other words, the oxide semiconductor functions as an oxide conductor (OC). The formation of a metal nitride by a sputtering method for the conductive film 260B produces the following effects: the resistance of the conductive film 260A is reduced by the diffusion of the constituent element (especially, nitrogen) of the metal nitride to the conductive film 260A; and the resistance is reduced by damage (e.g., sputtering damage) caused during the deposition of the conductive film 260B. Accordingly, the conductive film 260A has a higher carrier density and thus has a higher conductivity.

The conductive film 260A is preferably formed by a sputtering method in an atmosphere containing an oxygen gas. In the case where the conductive film 260A is formed in an atmosphere containing an oxygen gas, an excess-oxygen region can be formed in the insulator 250. Note that a method for forming the conductive film 260A is not limited to a sputtering method, and other methods such as an ALD method may be used.

Furthermore, when a low-resistance metal film is stacked as the conductive film 260C, a transistor with a low driving voltage can be provided.

Figure 4E:
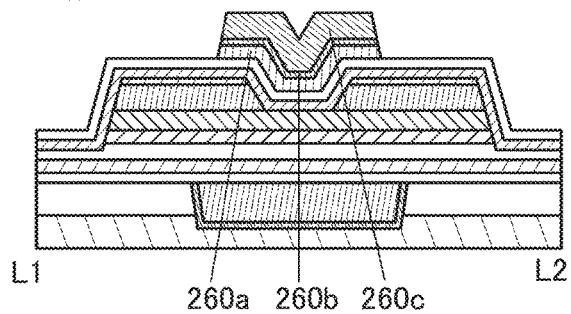
Figure 4F:
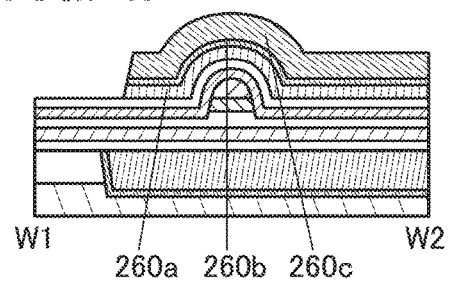

Then, a resist mask is formed over the conductive film 260C by a photolithography method. Part of the conductive film 260A, part of the conductive film 260B, and part of the conductive film 260C are selectively removed using the resist mask, so that the conductor 260 is formed (FIGS. 4E and 4F).

Figure 4G:
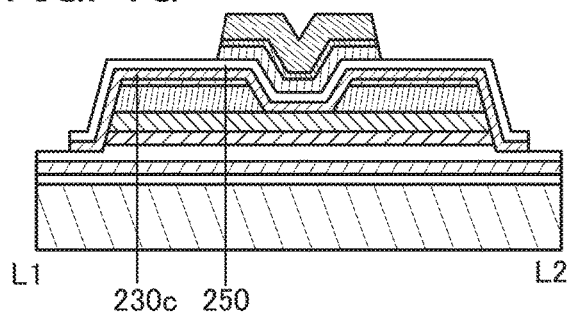
Figure 4H:
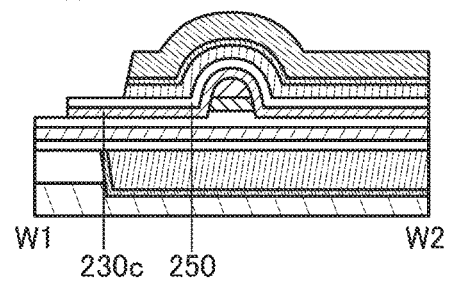

Next, a resist mask is formed over the conductor 260 and the insulating film 250A by a photolithography method. Part of the insulating film 250A and part of the oxide film 230C are selectively removed using the resist mask, so that the insulator 250 and the oxide 230c are formed (FIGS. 4G and 4H).

Then, the insulators 272 and 274 are formed. A dense film with good coverage is preferably used as the insulator 272. In addition, the insulators 272 and 274 preferably have a barrier property against oxygen, hydrogen, and water. When the stack of the insulators 272 and 274 has a barrier property against oxygen, oxygen in the excess-oxygen region is not diffused outside the transistor 200 but supplied to the oxide 230 efficiently.

When the stack of the insulators 272 and 274 has a barrier property against hydrogen and water, hydrogen and water outside the transistor 200 are not diffused into the transistor 200, and generation of oxygen vacancies in the oxide 230 can be inhibited.

Figure 5A:
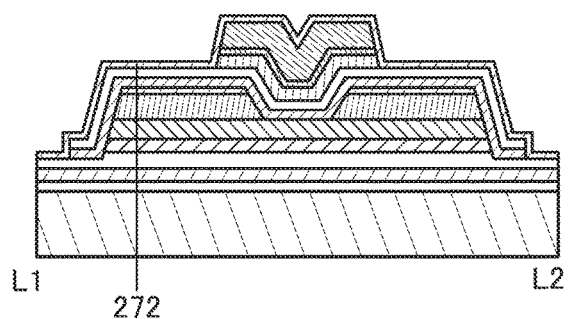
FIGS. 5A to 5F are cross-sectional views illustrating a method for manufacturing a semiconductor device of one embodiment of the present invention.
Figure 5B:
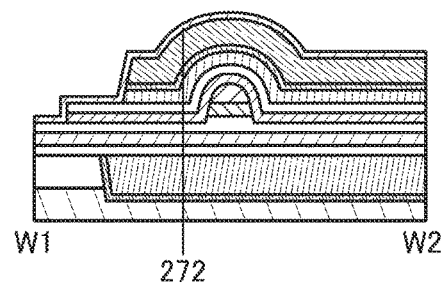

For example, as the insulator 272, an aluminum oxide film is formed by an ALD method to a thickness less than or equal to 3 nm, preferably greater than or equal to 0.5 nm and less than or equal to 1.5 nm (FIGS. 5A and 5B). The ALD method allows forming of the dense insulator 272 that has reduced defects such as cracks and pinholes or has a uniform thickness. In addition, the ALD method causes less damage on an object under a film to be formed than a sputtering method, which enables the interface between the insulators 250 and 272 to be maintained properly.

Figure 5C:
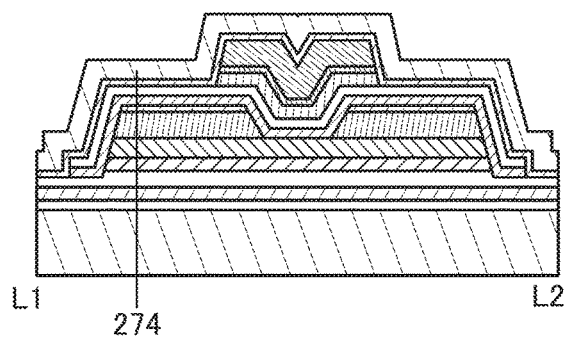
Figure 5D:
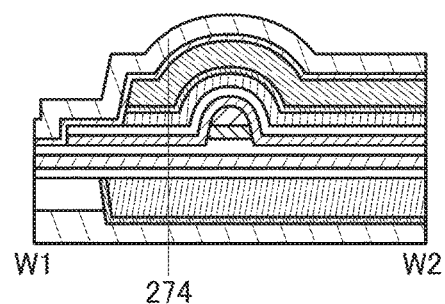
Figure 5E:
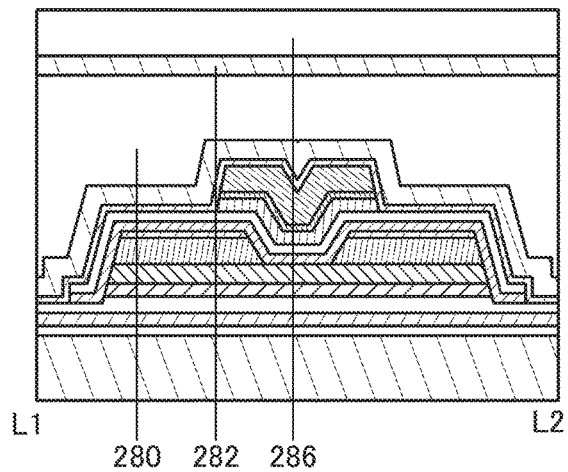
Figure 5F:
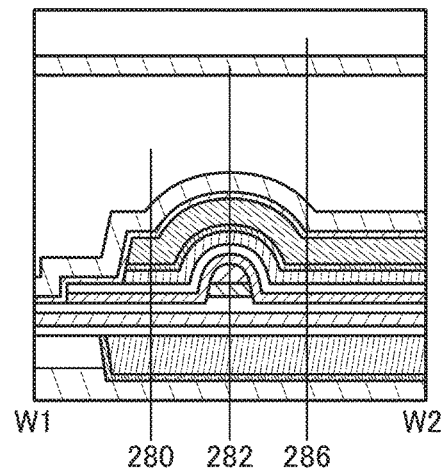

As the insulator 274, for example, an aluminum oxide film is formed by a sputtering method to a thickness greater than 3 nm (FIGS. 5C and 5D).

When the insulator 274 is formed by a sputtering method, an excess-oxygen region can be easily formed in the insulators 250 and 224.

During deposition by a sputtering method, ions and sputtered particles exist between a target and a substrate. The ions in plasma are accelerated by a potential difference and collide with the target; accordingly, sputtered particles are ejected from the target. These sputtered particles are attached to a deposition surface and deposited thereover; as a result, a film is formed.

At that time, the ions in the plasma are accelerated by a potential difference and collide with the deposition surface, and are sometimes taken into the insulator 272 and the layers thereunder through the formed film. Some ions recoil by the target and might be taken, as recoil ions, into the insulator 272 and the layers thereunder through the formed film.

Particularly when the insulator 272 has a small thickness, ions and recoil ions reach the inside of the insulators 250 and 224 through the insulator 272. When the ions are taken into the insulators 250 and 224, a region into which the ions are taken is formed in the insulators 250 and 224. That is, an excess-oxygen region is formed in the insulators 250 and 224 in the case where the ions include oxygen.

Introduction of excess oxygen to the insulators 250 and 224 can form an excess-oxygen region. The excess oxygen in the insulators 250 and 224 is supplied to the oxide 230 and can fill oxygen vacancies in the oxide 230.

Accordingly, when the insulator 274 is formed in an oxygen gas atmosphere with a sputtering apparatus, oxygen can be introduced into the insulators 250 and 224 while the insulator 274 is formed. When aluminum oxide having a barrier property against oxygen, hydrogen, and water is used for the insulator 274, for example, excess oxygen introduced into the insulators 250 and 224 can be effectively sealed in on the transistor 200 side.

When an aluminum oxide film is formed by a sputtering method, because the sputtering method achieves a higher deposition rate than the ALD method, the insulator 274 with a thickness greater than or equal to 3 nm, which is thick enough to ensure a barrier property against oxygen, hydrogen, and water, can be formed with high yield.

When the insulator 274 having a barrier property against oxygen, hydrogen, and water is stacked over the dense insulator 272 with good coverage, an insulator having a high barrier property can be obtained. The insulators 272 and 274 are preferably formed with the same type of material, in which case processing in later steps is facilitated. For example, in the case where an opening is formed to reach the conductor 240, 260, or the like, the opening can be formed in the insulators 272 and 274 under the same processing conditions.

Furthermore, when an aluminum oxide film formed by a sputtering method is stacked over an aluminum oxide film formed by an ALD method, a highly reliable stack can be obtained with high productivity.

Note that the insulators 272 and 274 are preferably formed while the substrate is being heated. The substrate is heated preferably to higher than 100° C. and lower than or equal to 300° C. Water in the oxide 230 or the insulator 272 can be removed when the substrate is heated to higher than 100° C. Moreover, water can be prevented from adsorbing on the surface of the formed film. Moreover, by forming the insulators 272 and 274 while the substrate is being heated in this manner, oxygen can be diffused to the oxide 230 during the deposition.

Through the above steps, the transistor 200 of one embodiment of the present invention can be manufactured.

Then, the insulator 280 is formed over the transistor 200. After an insulator to be the insulator 280 is formed, planarization treatment using a CMP method or the like may be performed to improve the planarity of a top surface of the insulator.

After that, the insulator 282 is formed over the insulator 280. The insulator 282 is preferably formed with a sputtering apparatus.

Then, the insulator 286 is formed over the insulator 282. As the insulator 286, for example, an insulator containing oxygen, such as a silicon oxide film or a silicon oxynitride film, is formed by a CVD method. The insulator 286 preferably has a lower permittivity than the insulator 282. In the case where a material with a low permittivity is used for an interlayer film, the parasitic capacitance between wirings can be reduced.

Through the above steps, the semiconductor device of one embodiment of the present invention can be manufactured.

<Structure of Transistor: 2>

Figure 6A:
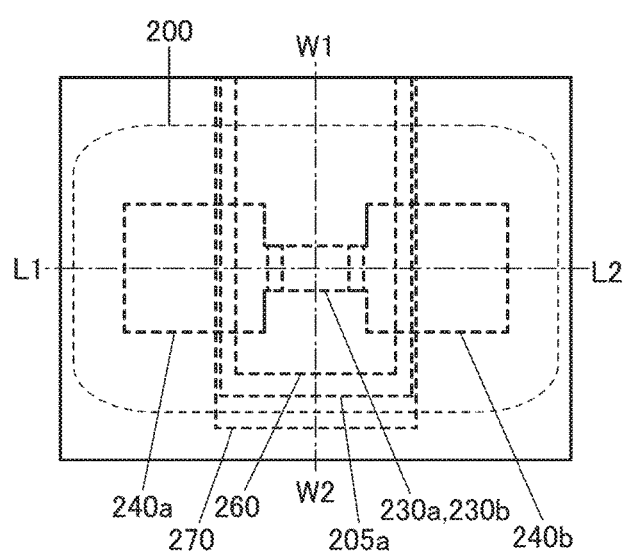
FIGS. 6A to 6C are a top view and cross-sectional views illustrating a structure of a semiconductor device of one embodiment of the present invention.
Figure 6C:
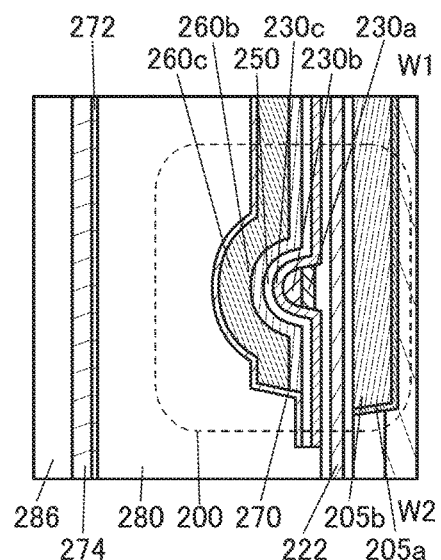
Figure 6B:
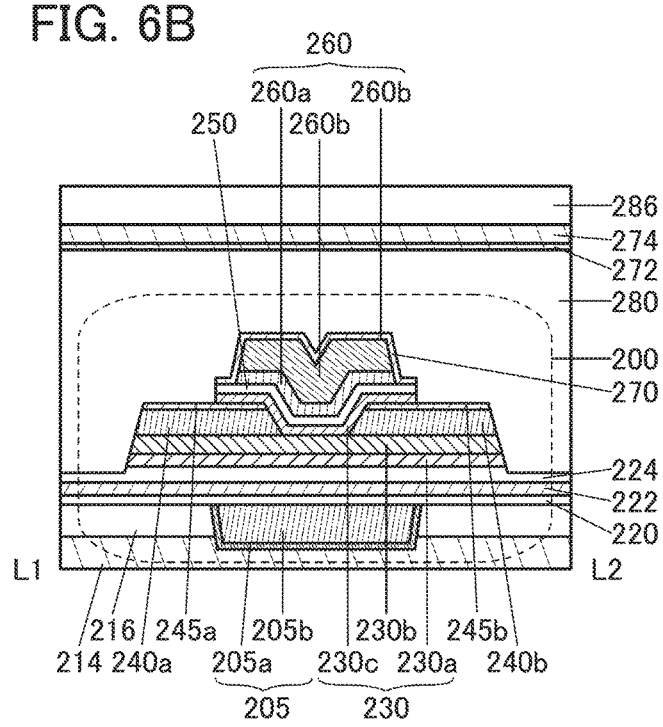

FIGS. 6A to 6C illustrate an example of a semiconductor device including the transistor 200. FIG. 6A is a top view of the semiconductor device. Note that some films are omitted in FIG. 6A for clarity of the drawing. FIG. 6B is a cross-sectional view taken along dashed-dotted line L1-L2 in FIG. 6A, and FIG. 6C is a cross-sectional view taken along dashed-dotted line W1-W2.

Note that in the semiconductor device illustrated in FIGS. 6A to 6C, components having the same functions as the components in the semiconductor device in FIGS. 1A to 1C are denoted by the same reference numerals.

In the structure illustrated in FIGS. 6A to 6C, the oxide 230c over the barrier layers 245a and 245b is removed; accordingly, side surfaces of the oxide 230 and the insulator 250 are in contact with the insulator 280. Since the insulators 272 and 274 are provided over the insulator 280, the insulator 280 includes an excess-oxygen region.

The insulator 280 is an insulator containing oxygen, such as a silicon oxide film or a silicon oxynitride film. As the insulator containing excess oxygen, a silicon oxide film or a silicon oxynitride film containing a large amount of oxygen can be formed by a CVD method or a sputtering method under the conditions that are set as appropriate.

To make the insulator 280 contain excess oxygen, the insulator 280 is formed in an oxygen atmosphere, for example. Alternatively, a region containing excess oxygen may be formed by introducing oxygen into the insulator 280 that has been formed. Both the methods may be used in combination.

For example, oxygen (at least including any of oxygen radicals, oxygen atoms, and oxygen ions) is introduced into the insulator 280 that has been formed, whereby a region containing excess oxygen is formed. Oxygen can be introduced by an ion implantation method, an ion doping method, a plasma immersion ion implantation method, plasma treatment, or the like.

A gas containing oxygen can be used for the oxygen introduction treatment. As a gas containing oxygen, oxygen, dinitrogen monoxide, nitrogen dioxide, carbon dioxide, carbon monoxide, or the like can be used. A rare gas may be contained in the oxygen-containing gas in introducing oxygen. For example, a mixed gas of carbon dioxide, hydrogen, and argon can be used.

Then, the insulators 272 and 274 are formed over the insulator 280. Preferably, the insulator 272 is formed with an ALD apparatus while the insulator 274 is formed with a sputtering apparatus. With that structure, an excess-oxygen region can be formed easily in the insulator 280 positioned under the insulator 274.

In the structure illustrated in FIGS. 6A to 6C, the insulators 272 and 274 serve as interlayer films, which allows the simplification of the process. In addition, the insulator including the excess-oxygen region can have a relatively large volume, so that a large amount of excess oxygen can be supplied to the transistor 200. This enables high integration of a semiconductor device including a plurality of transistors 200.

In the structure illustrated in FIGS. 6A to 6C, the conductor 260 has a two-layer structure. For example, the conductor 260a is formed by a thermal CVD method, an MOCVD method, or an ALD method. In particular, the conductor 260a is preferably formed by an ALD method. By employing the ALD method or the like, damage to the insulator 250 at the time of the deposition can be reduced. In addition, the ALD method or the like is preferable because it can improve the coverage. Thus, the transistor 200 having high reliability can be provided.

Next, the conductor 260b is formed by a sputtering method. At that time, since the conductor 260a is provided over the insulator 250, damage caused during deposition of the conductor 260b can be prevented from affecting the insulator 250. Since the deposition rate in a sputtering method is higher than that in an ALD method, the productivity can be improved with a high yield.

In the structure illustrated in FIGS. 6A to 6C, a barrier layer 270 is preferably provided to cover the conductor 260.

Depending on the material used for the conductor 260, the resistance of the conductor 260 might be increased by oxidation of the conductor 260 in the post-process such as heat treatment, for example. Furthermore, when excess oxygen is supplied to the oxide 230b, oxygen might be absorbed by the conductor 260. With the use of the barrier layer 270, the oxidization of the conductor 260 can be inhibited and the shortage of oxygen supplied to the oxide 230 can be inhibited.

The structures, the methods, and the like described in this embodiment can be combined as appropriate with any of the structures, the methods, and the like described in the other embodiments and Example.

Embodiment 2

In this embodiment, one mode of a semiconductor device will be described with reference to FIG. 7 to FIG. 11.
[Memory Device 1]

Examples of a semiconductor device (a memory device) including a capacitor that is one embodiment of the present invention are illustrated in FIG. 7 to FIG. 10.

Figure 7:
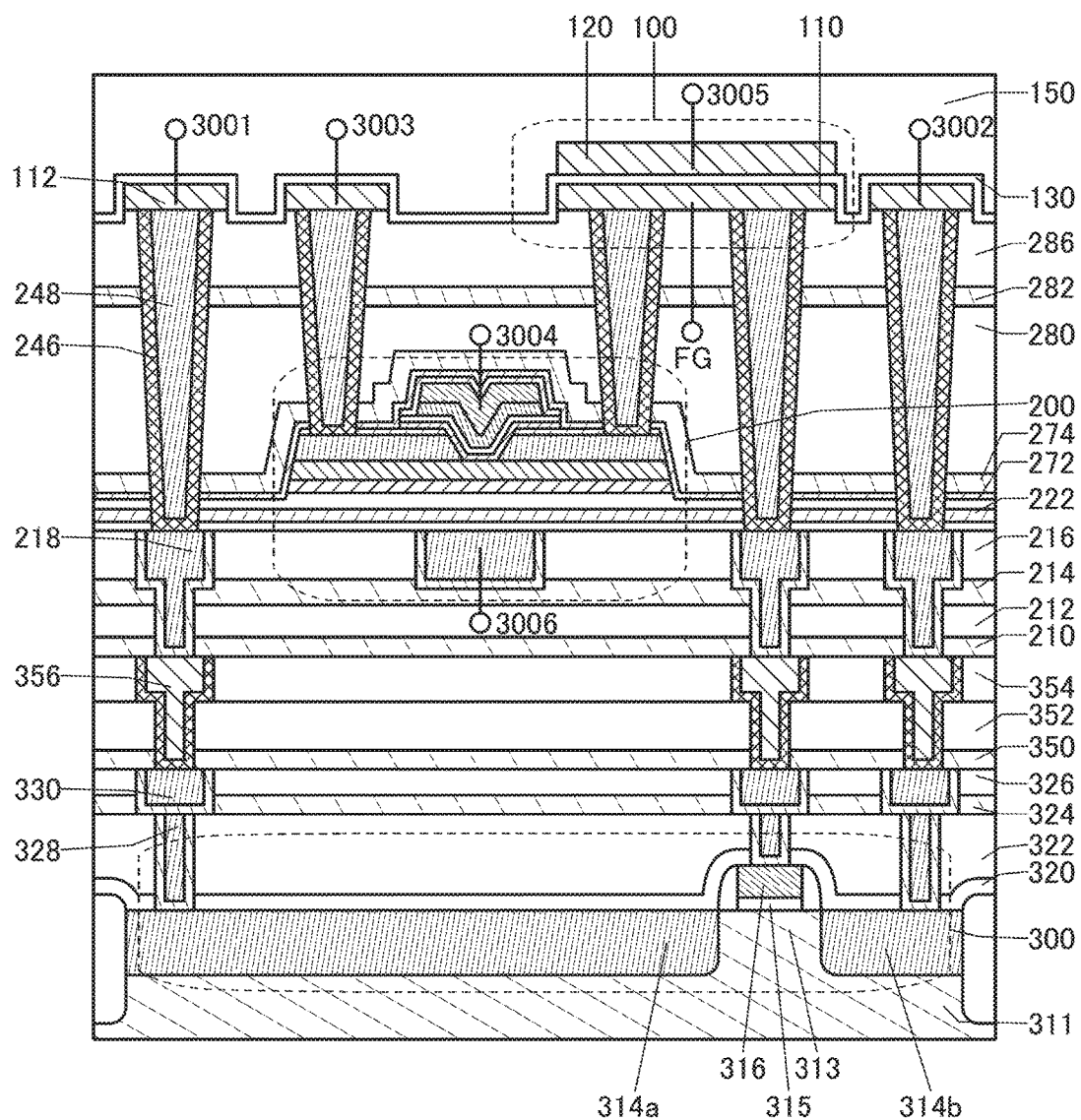
FIG. 7 is a cross-sectional view illustrating a structure of a memory device of one embodiment of the present invention.
Figure 8:
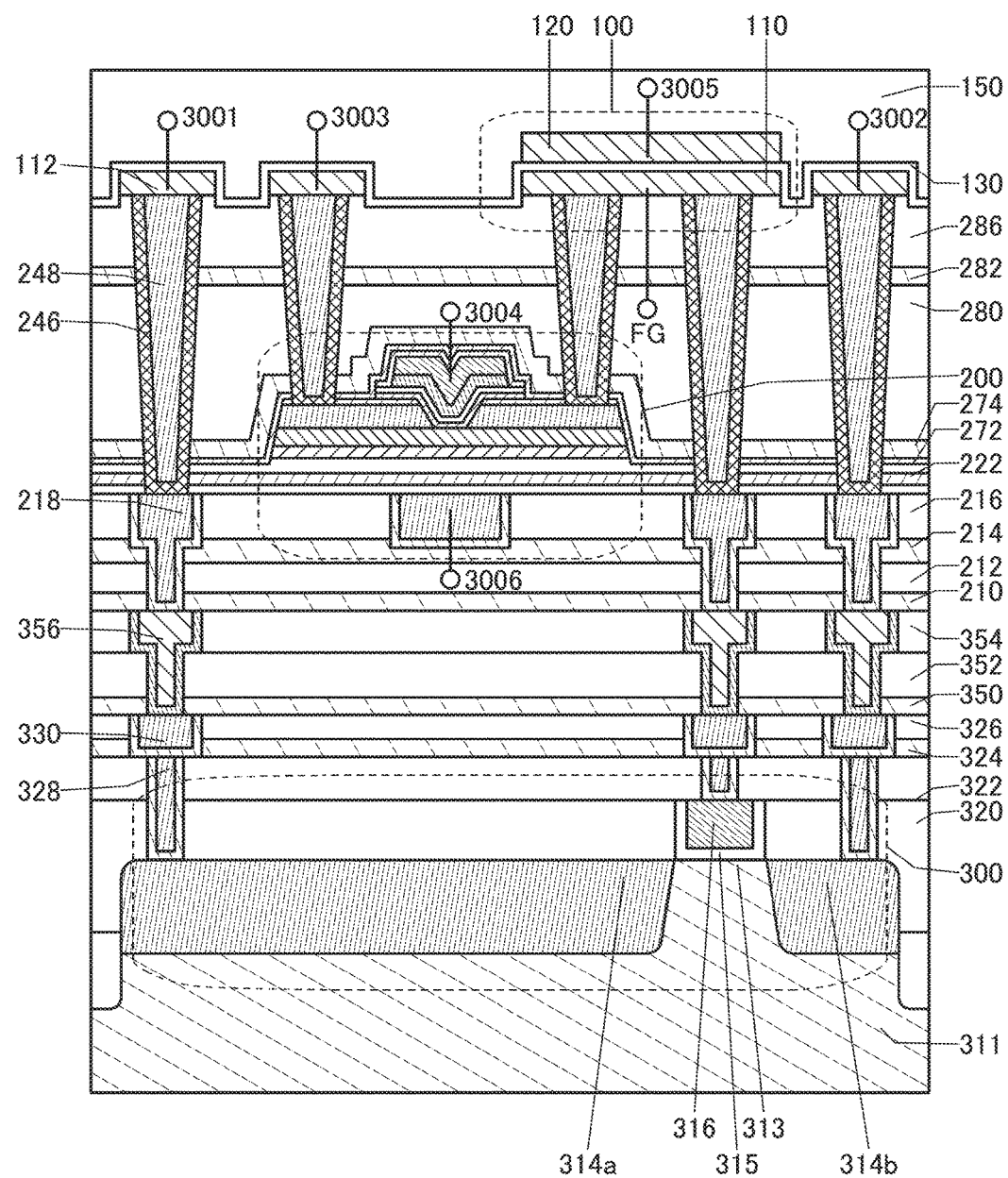
FIG. 8 is a cross-sectional view illustrating a structure of a memory device of one embodiment of the present invention.

Semiconductor devices illustrated in FIG. 7 and FIG. 8 each include a transistor 300, a transistor 200, and a capacitor 100.

The transistor 200 is a transistor in which a channel is formed in a semiconductor layer including an oxide semiconductor. Since the off-state current of the transistor 200 is low, by using the transistor 200 in a memory device, stored data can be retained for a long time. In other words, such a memory device does not require refresh operation or has an extremely low frequency of the refresh operation, which leads to a sufficient reduction in power consumption.

In FIG. 7 and FIG. 8, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor devices illustrated in FIG. 7 and FIG. 8 each have a feature that the potential of the gate of the transistor 300 can be retained, and thus enable writing, retaining, and reading of data as follows.

Writing and retaining of data will be described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained at the node FG (retaining).

In the case where the off-state current of the transistor 200 is low, the charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to make the transistor 300 be in "on state." Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0$ ($>V_{th\_H}$), the transistor 300 is brought into "on state." On the other hand, in the case where the low-level charge is supplied to the node FG in writing, even when the potential of the wiring 3005 is $V_0$ ($<V_{th\_L}$) a the transistor 300 remains in "off state." Thus, the data retained in the node FG can be read by determining the potential of the wiring 3002.

By arranging semiconductor devices each having the structure illustrated in FIG. 7 and FIG. 8 in a matrix, a memory cell array can be formed.

Note that in the case where memory cells are arrayed, it is necessary that data of a desired memory cell be read in read operation. For example, when a p-channel transistor is used as the transistor 300, the memory cell has a NOR-type structure. Thus, only data of a desired memory cell can be read by supplying a potential at which the transistor 300 is in "off state" regardless of the charge supplied to the node FG, that is, a potential lower than $V_{th\_H}$ to the wiring 3005 of memory cells from which data is not read. Alternatively, when an n-channel transistor is used as the transistor 300, the memory cell has a NAND-type structure. Thus, only data of a desired memory cell can be read by supplying a potential at which the transistor 300 is in "on state" regardless of the charge supplied to the node FG, that is, a potential higher than $V_{th\_L}$ to the wiring 3005 of memory cells from which data is not read.

<Structure of Semiconductor Device 1>

The semiconductor device of one embodiment of the present invention includes the transistor 300, the transistor 200, and the capacitor 100 as illustrated in FIG. 7. The transistor 200 is provided above the transistor 300, and the capacitor 100 is provided above the transistor 300 and the transistor 200.

The transistor 300 is provided over a substrate 311 and includes a conductor 316, an insulator 315, a semiconductor region 313 that is a part of the substrate 311, and low-resistance regions 314a and 314b serving as a source region and a drain region.

The transistor 300 may be a p-channel transistor or an n-channel transistor.

It is preferable that a region of the semiconductor region 313 where a channel is formed, a region in the vicinity thereof, the low-resistance regions 314a and 314b serving as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 serving as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 7 is only an example and is not limited to the structure illustrated therein; an appropriate transistor may be used in accordance with a circuit configuration or a driving method.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like into a region where the transistor 200 is formed.

As an example of the film having a barrier property against hydrogen, a silicon nitride film formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used for an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each serve as a plug or a wiring. A plurality of structures of conductors serving as plugs or wirings are collectively denoted by the same reference numeral in some cases. Furthermore, in this specification and the like, a wiring and a plug electrically connected to the wiring may be a single component. That is, there are cases where part of a conductor serves as a wiring and part of a conductor serves as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 7, an insulator 350, an insulator 352, and an insulator 354 are stacked sequentially. Furthermore, a conductor 356 is formed in the insulator 350, the insulator 352, and the insulator 354. The conductor 356 serves as a plug or a wiring. Note that the conductor 356 can be formed using a material similar to those used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride may be used, for example. By stacking tantalum nitride and tungsten, which has high conductivity, the diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 210, an insulator 212, the insulator 214, and the insulator 216 are stacked sequentially over the insulator 354. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 300 is formed, or the like to a region where the transistor 200 is formed. Therefore, the insulators 210 and 214 can be formed using a material similar to that used for forming the insulator 324.

As an example of the film having a barrier property against hydrogen, a silicon nitride film formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulators 212 and 216 can be formed using a material similar to that used for forming the insulator 320. In the case where interlayer films formed of a material with a relatively low permittivity are used for the insulators, the parasitic capacitance between wirings can be reduced. For example, a silicon oxide film, a silicon oxynitride film, or the like can be used for the insulators 212 and 216.

A conductor 218, a conductor (the conductor 205) included in the transistor 200, and the like are provided in the insulators 210, 212, 214, and 216. Note that the conductor 218 serves as a plug or a wiring that is electrically connected to the capacitor 100 or the transistor 300. The conductor 218 can be formed using a material similar to those used for forming the conductors 328 and 330.

In particular, part of the conductor 218 that is in contact with the insulators 210 and 214 is preferably a conductor with a barrier property against oxygen, hydrogen, and water. In such a structure, the transistors 300 and 200 can be completely separated by the layer with a barrier property against oxygen, hydrogen, and water. As a result, the diffusion of hydrogen from the transistor 300 to the transistor 200 can be prevented.

The transistor 200 is provided over the insulator 216. Note that the structure of the transistor described in the above embodiment can be used as the structure of the transistor 200. Note that the transistor 200 in FIG. 7 is only an example and is not limited to the structure illustrated therein; an appropriate transistor may be used in accordance with a circuit configuration or a driving method.

The insulator 280 is provided over the transistor 200. In the insulator 280, an excess-oxygen region is preferably formed. In particular, in the case of using an oxide semiconductor in the transistor 200, when an insulator including an excess-oxygen region is provided in an interlayer film or the like in the vicinity of the transistor 200, oxygen vacancies in the oxide 230 included in the transistor 200 are reduced, whereby the reliability can be improved. The insulator 280 that covers the transistor 200 may serve as a planarization film that covers a roughness thereunder.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 282 is provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

The insulator 286 is provided over the insulator 282. The insulator 286 can be formed using a material similar to that of the insulator 320. In the case where an interlayer film formed of a material with a relatively low permittivity is used for the insulator, the parasitic capacitance between wirings can be reduced. For example, a silicon oxide film, a silicon oxynitride film, or the like can be used for the insulator 286.

The conductors 246, the conductors 248, and the like are provided in the insulators 220, 222, 224, 280, 282, and 286.

The conductors 246 and 248 serve as plugs or wirings that are electrically connected to the capacitor 100, the transistor 200, or the transistor 300. The conductors 246 and 248 can be formed using a material similar to those used for forming the conductors 328 and 330.

The capacitor 100 is provided above the transistor 200. The capacitor 100 includes a conductor 110, a conductor 120, and an insulator 130.

A conductor 112 may be provided over the conductors 246 and 248. The conductor 112 serves as a plug or a wiring that is electrically connected to the capacitor 100, the transistor 200, or the transistor 300. The conductor 110 serves as the one electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 7; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may serve as a planarization film that covers a roughness thereunder.

The above is the description of the structure example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

<Modification Example of Memory Device 1>

FIG. 8 illustrates a modification example of this embodiment. FIG. 8 is different from FIG. 7 in the structure of the transistor 300.

In the transistor 300 illustrated in FIG. 8, the semiconductor region 313 (part of the substrate 311) in which the channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

<Structure of Memory Cell Array>

Figure 9:
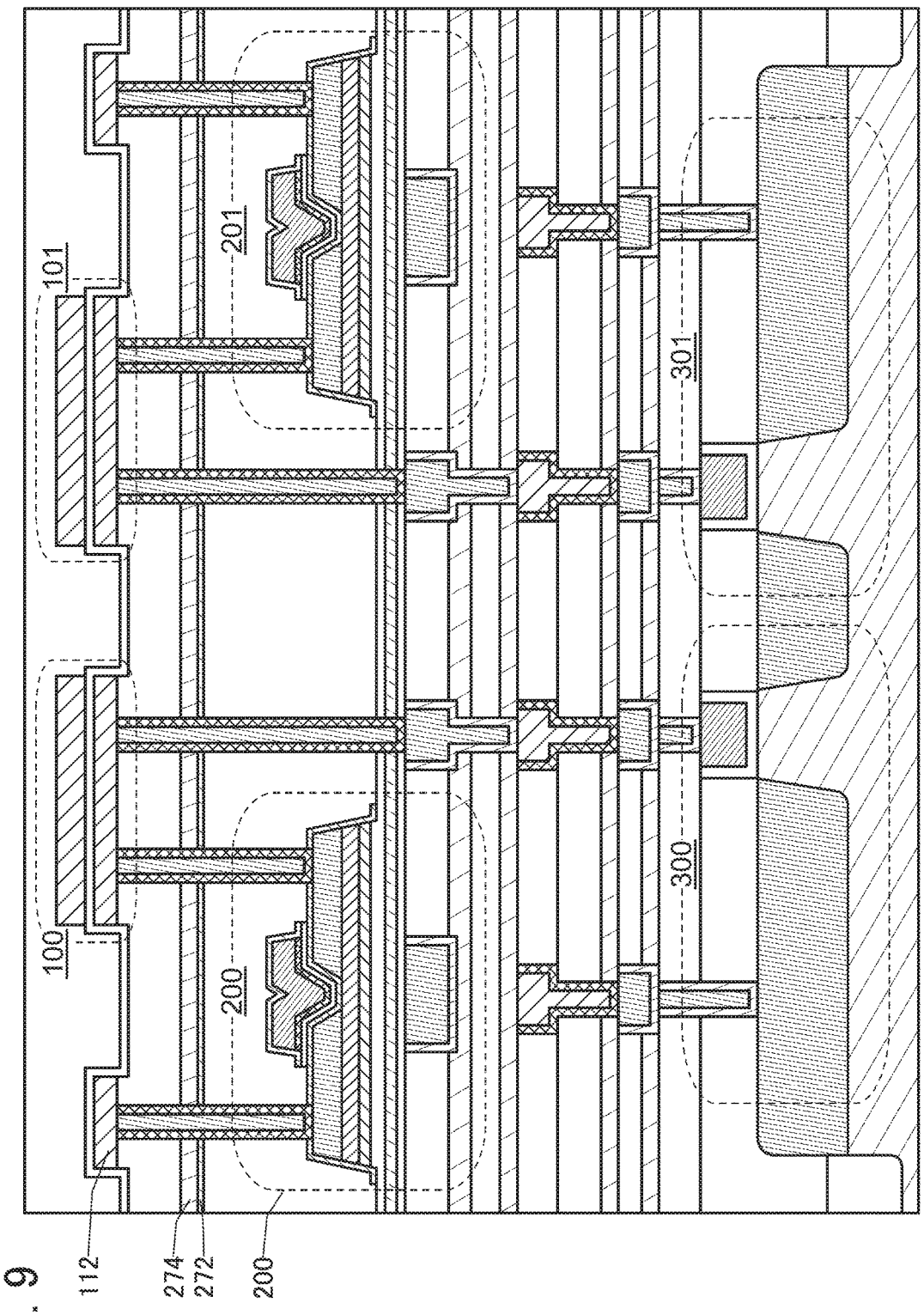
FIG. 9 is a cross-sectional view illustrating a structure of a memory device of one embodiment of the present invention.

FIG. 9 illustrates an example of a memory cell array of this embodiment. FIG. 9 is a cross-sectional view that shows part of a row in which the memory devices each of which is illustrated in FIG. 7 and FIG. 8 are arranged in a matrix.

In FIG. 9, the semiconductor device which includes the transistor 300, the transistor 200, and the capacitor 100 and a semiconductor which includes a transistor 301, a transistor 201, and a capacitor 101 are arranged in the same row.

As illustrated in FIG. 9, the memory cell array includes a plurality of transistors (the transistors 200 and 201 in the drawing).

In the case of increasing the transistor integration degree, an excess-oxygen region is preferably provided in an insulator serving as an interlayer film in order to ensure the volume of the insulator including the excess-oxygen region. Thus, the insulators 272 and 274 are preferably provided over the interlayer film.

With such a structure, excess oxygen can be supplied to the transistor 200 stably regardless of the shape or the position of the plug or the wiring provided in the semiconductor device or the number of the plugs or the wirings. Since oxygen vacancies are less likely to be formed when the diffusion of hydrogen is inhibited, generation of carriers can be inhibited. Thus, the transistor 200 can have stable electrical characteristics.

[Memory Device 2]

Figure 10:
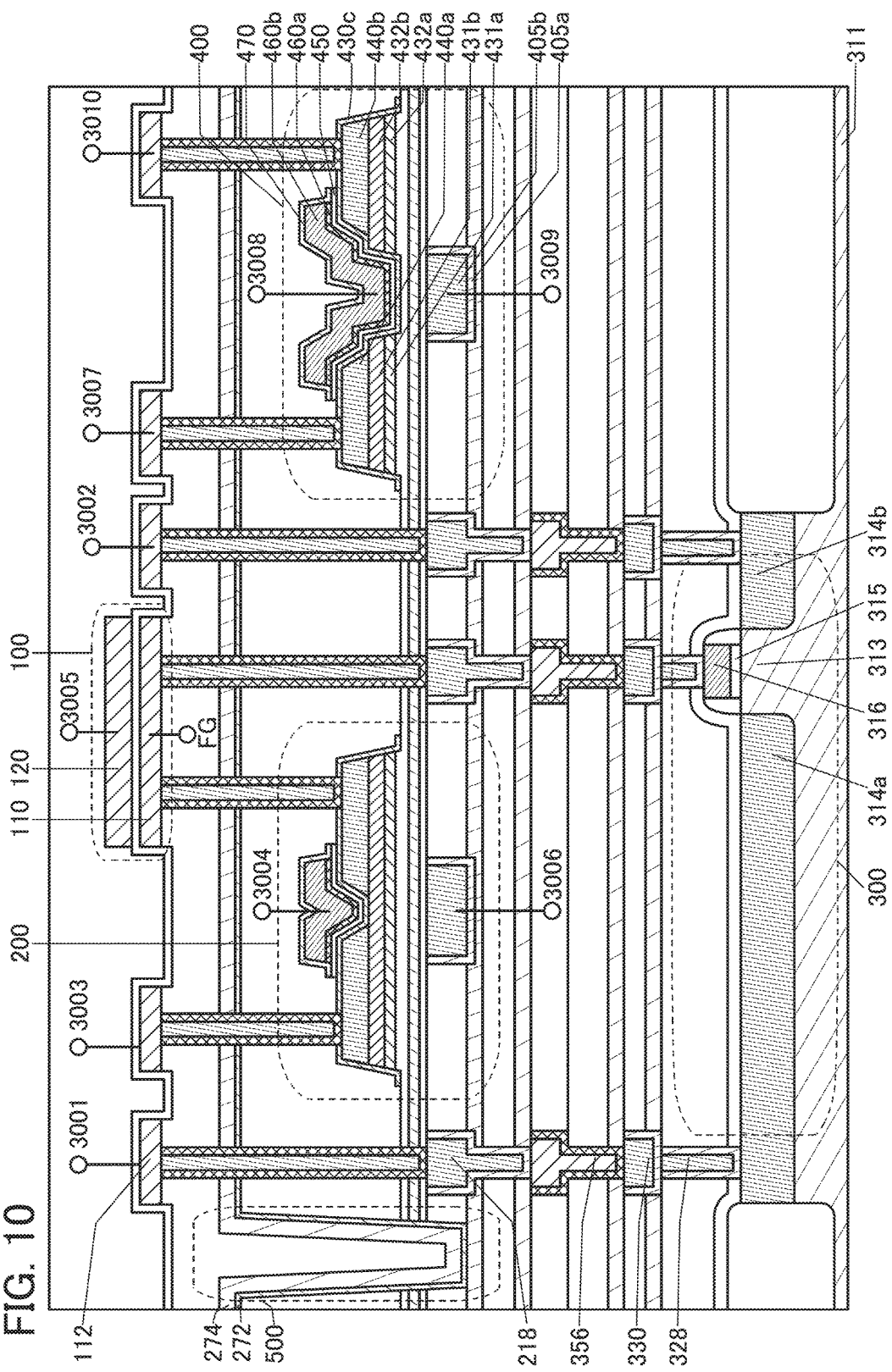
FIG. 10 is a cross-sectional view illustrating a structure of a memory device of one embodiment of the present invention.

FIG. 10 illustrates an example of a memory device using the semiconductor device of one embodiment of the present invention.

The memory device illustrated in FIG. 10 includes a transistor 400 in addition to the semiconductor device illustrated in FIG. 7 that includes the transistor 200, the transistor 300, and the capacitor 100.

The transistor 400 can control a second gate voltage of the transistor 200. For example, a first gate and a second gate of the transistor 400 are diode-connected to a source thereof, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistors 200 and 400. Accordingly, the memory device including the transistors 200 and 400 can retain stored data for a long time.

In FIG. 10, the wiring 3001 is electrically connected to the source of the transistor 300, and the wiring 3002 is electrically connected to the drain of the transistor 300. The wiring 3003 is electrically connected to one of the source and the drain of the transistor 200. The wiring 3004 is electrically connected to the first gate of the transistor 200. The wiring 3006 is electrically connected to the second gate of the transistor 200. The gate of the transistor 300 and the other of the source and the drain of the transistor 200 are electrically connected to one electrode of the capacitor 100. The wiring 3005 is electrically connected to the other electrode of the capacitor 100. A wiring 3007 is electrically connected to the source of the transistor 400. A wiring 3008 is electrically connected to the first gate of the transistor 400. A wiring 3009 is electrically connected to the second gate of the transistor 400. A wiring 3010 is electrically connected to the drain of the transistor 400. The wirings 3006, 3007, 3008, and 3009 are electrically connected one another.

The memory device illustrated in FIG. 10 has a feature that the potential of the gate of the transistor 300 can be held and thus enables writing, retaining, and reading of data.

When the memory devices in FIG. 10 are arranged in a matrix like the memory devices illustrated in FIG. 7, a memory cell array can be formed. Note that one transistor 400 can control the second gate voltages of a plurality of transistors 200; hence, the number of transistors 400 may be smaller than that of transistors 200.

<Structure of Memory Device 2>

The transistor 400 and the transistor 200 are formed in the same layer and thus can be fabricated in parallel. The transistor 400 includes a conductor 460a and a conductor 460b serving as a first gate electrode, a conductor 405a and a conductor 405b serving as a second gate electrode, a barrier layer 470 in contact with the conductors 460a and 460b, the insulators 220, 222, and 224 and an insulator 450 serving as gate insulating layers, an oxide 430c including a region where a channel is formed, a conductor 440a and oxides 431a and 431b serving as one of a source and a drain, and a conductor 440b and oxides 432a and 432b serving as the other of the source and the drain.

The conductors 405a and 405b in the transistor 400 is in the same layer as the conductor 205 in the transistor 200. The oxides 431a and 432a are in the same layer as the oxide 230a in the transistor 200, and the oxides 431b and 432b are in the same layer as the oxide 230b in the transistor 200. The conductors 440a and 440b are in the same layer as the conductors 240 in the transistor 200. The oxide 430c is in the same layer as the oxide 230c in the transistor 200. The insulator 450 is in the same layer as the insulator 250 in the transistor 200. The conductors 460a and 460b is in the same layer as the conductor 260 in the transistor 200. The barrier layer 470 is in the same layer as the barrier layer 270 in the transistor 200.

In the oxide 430c serving as an active layer of the transistor 400, oxygen vacancies and impurities such as hydrogen or water are reduced, as in the oxide 230 or the like of the transistor 200. Accordingly, the threshold voltage of the transistor 400 can be higher than 0 V, an off-state current can be reduced, and the drain current when the second gate voltage and the first gate voltage are 0 V can be extremely low.

Description is made on a dicing line (also referred to as a scribe line, a dividing line, or a cutting line) that is provided when a large-sized substrate is divided into semiconductor elements so that a plurality of semiconductor devices are each formed in a chip form. In an example of a dividing method, for example, a groove (a dicing line) for separating the semiconductor elements is formed on the substrate, and then the substrate is cut along the dicing line so that a plurality of semiconductor devices that are separated are obtained. For example, FIG. 10 shows a cross-sectional view of a structure 500 around the dicing line.

As in the structure 500, for example, openings are provided in the insulators 280, 224, 222, 220, and 216 around a region overlapping with the dicing line formed in an end portion of the memory cell including the transistor 200 or the transistor 400. Furthermore, the insulators 272 and 274 are provided so as to cover side surfaces of the insulators 280, 224, 222, 220, and 216.

Thus, in the openings, the insulators 222 and 214 are in contact with the insulators 272 and 274. At that time, at least one of the insulators 222 and 214 is formed using the same material and method as those used for forming the insulators 272 and 274, whereby the adhesion therebetween can be improved. Aluminum oxide can be used, for example.

With such a structure, the insulator 280 and the transistors 200 and 400 can be enclosed with the insulators 214, 222, 272, and 274. Since the insulators 214, 222, 272, and 274 have functions of preventing the diffusion of oxygen, hydrogen, and water, even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 400 can be prevented.

Furthermore, in the structure, excess oxygen in the insulator 280 can be prevented from diffusing to the outside of the insulators 272, 274, and 222. Accordingly, excess oxygen in the insulator 280 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistor 200 or the transistor 400 can be prevented and the reliability can be improved.

<Modification Example of Memory Device 2>

Figure 11:
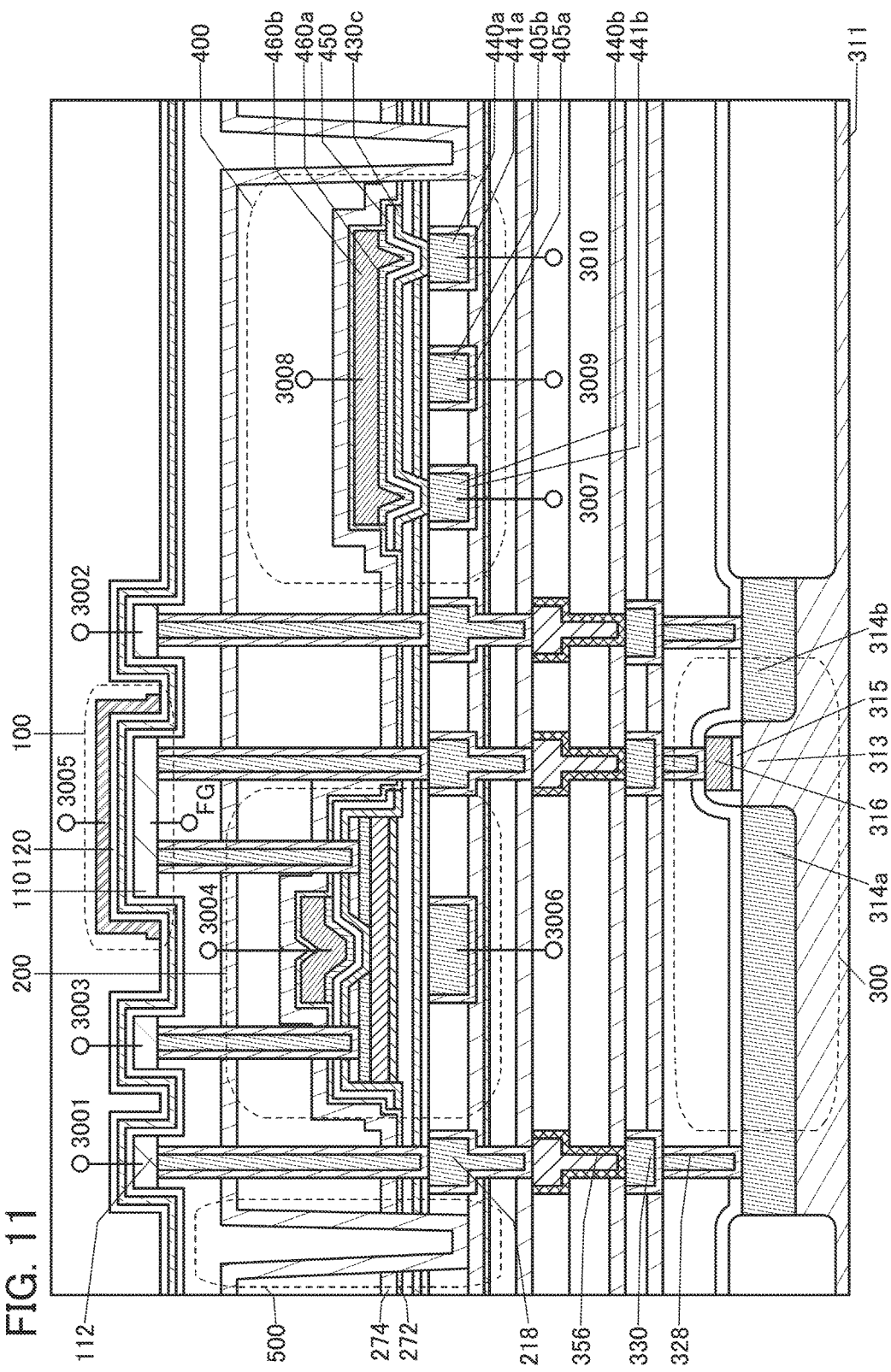
FIG. 11 is a cross-sectional view illustrating a structure of a memory device of one embodiment of the present invention.

FIG. 11 illustrates a modification example of this embodiment. FIG. 11 is different from FIG. 10 in the structure of the transistor 400.

In the transistor 400 illustrated in FIG. 11, the conductor 440a, a conductor 441a, the conductor 440b, and a conductor 441b are provided in the same layer as the conductors 405a and 405b. That is, the source or drain electrode of the transistor 400 can be provided concurrently with the second gate electrode.

The above is the description of the modification example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Embodiment 3

In this embodiment, one embodiment of a semiconductor device will be described with reference to FIGS. 12A and 12B and FIGS. 13A and 13B.

<Semiconductor Wafer and Chip>

Figure 12A:
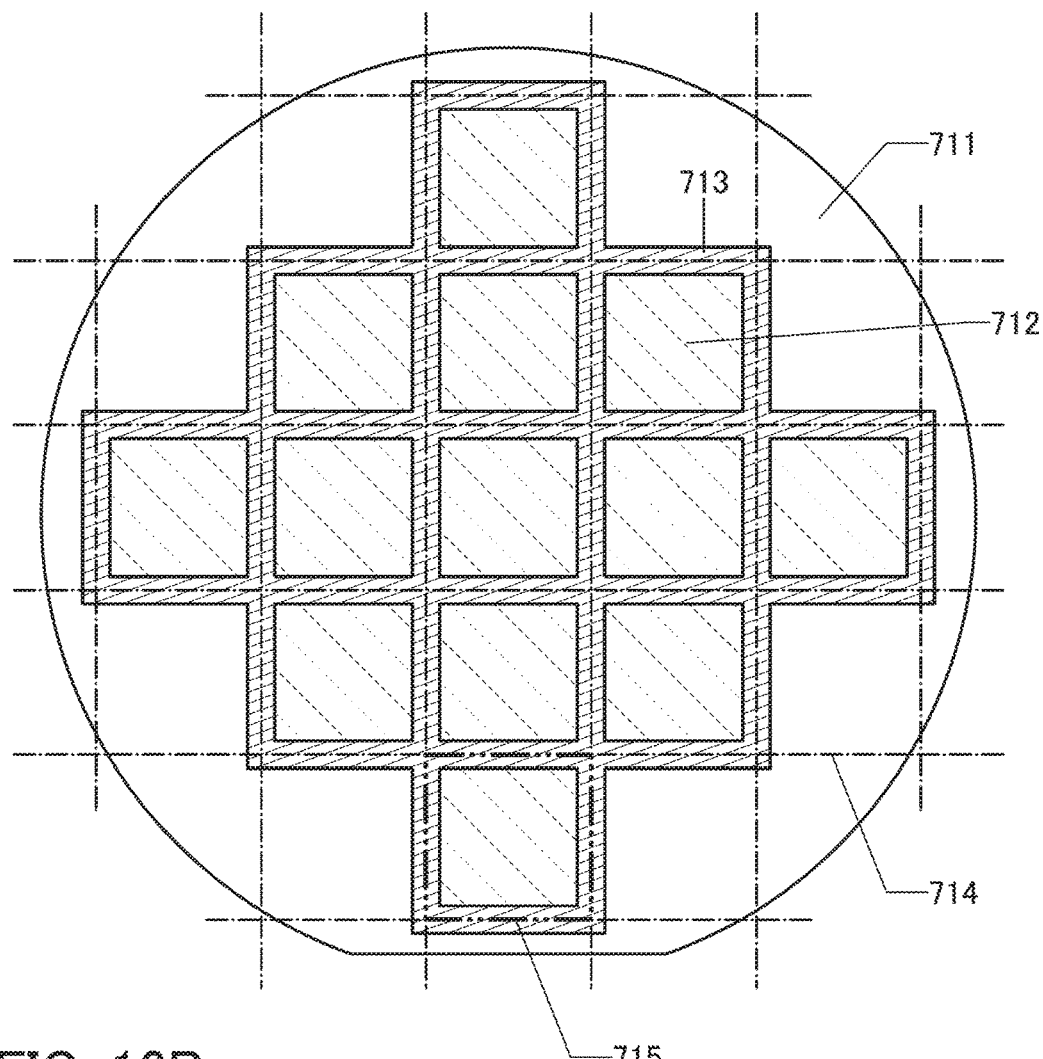
FIGS. 12A and 12B are top views of a semiconductor wafer of one embodiment of the present invention.

FIG. 12A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device or the like of one embodiment of the present invention can be provided in the circuit region 712.

Figure 12B:
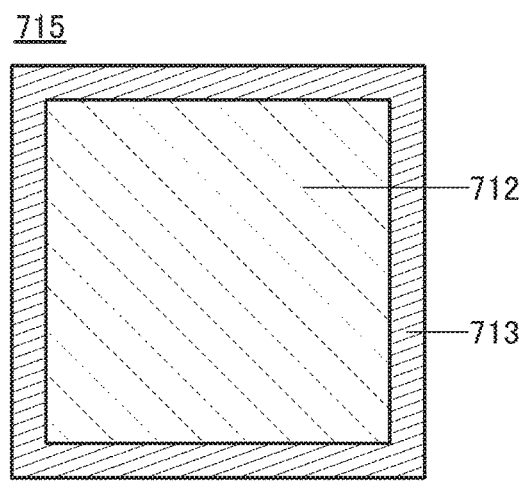

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 12B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.

<Electronic Component>

Figure 13A:
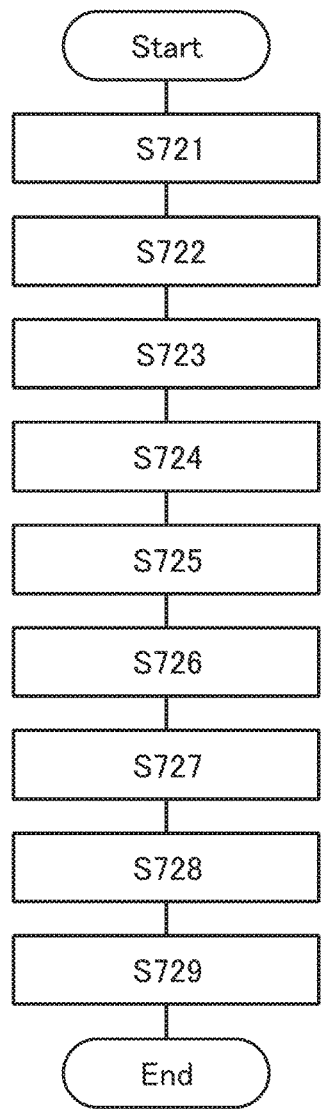
FIGS. 13A and 13B are a flow chart showing an example of steps for manufacturing electronic components and a schematic perspective view thereof.

An example of an electronic component using the chip 715 will be described with reference to FIGS. 13A and 13B. Note that the electronic component is also referred to as a semiconductor package or an IC package. The electronic component has a plurality of standards, names, and the like depending on a terminal extraction direction, a terminal shape, and the like.

The electronic component is completed when the semiconductor device described in the above embodiment is combined with components other than the semiconductor device in an assembly process (post-process).

The post-process will be described with reference to a flow chart in FIG. 13A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire or a gold wire can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed wiring board in a later step. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 13B:
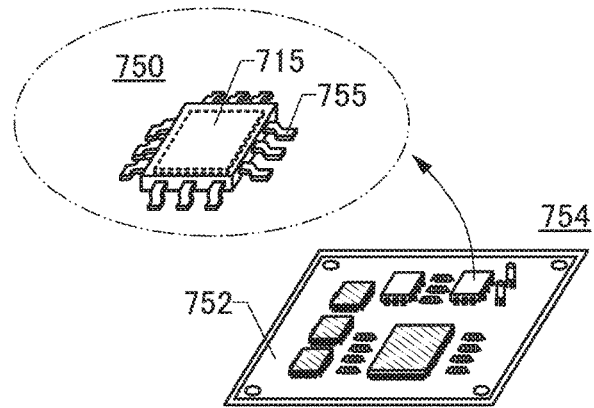

FIG. 13B is a perspective schematic diagram of a completed electronic component. FIG. 13B is a perspective schematic diagram illustrating a quad flat package (QFP) as an example of the electronic component. An electronic component 750 in FIG. 13B includes a lead 755 and the chip 715. The electronic component 750 may include more than one chip 715.

The electronic component 750 in FIG. 13B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Embodiment 4

<Electronic Device>

The semiconductor device of one embodiment of the present invention can be used in a variety of electronic devices. FIGS. 14A to 14G illustrate specific examples of electronic devices including the semiconductor device of one embodiment of the present invention.

Figure 14A:
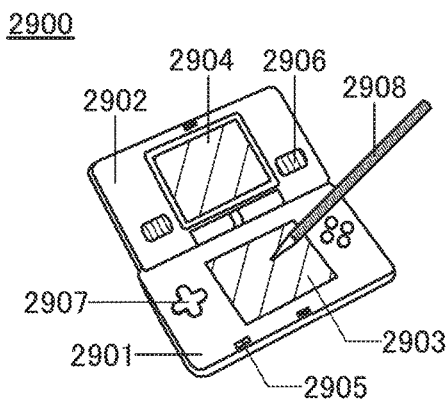
FIGS. 14A to 14G illustrate electronic devices of one embodiment of the present invention.

A portable game machine 2900 illustrated in FIG. 14A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 14A has the two display portions 2903 and 2904, the number of display portions is not limited to this. The display portion 2903 is provided with a touch screen as an input device, which can be handled with a stylus 2908 or the like.

Figure 14B:
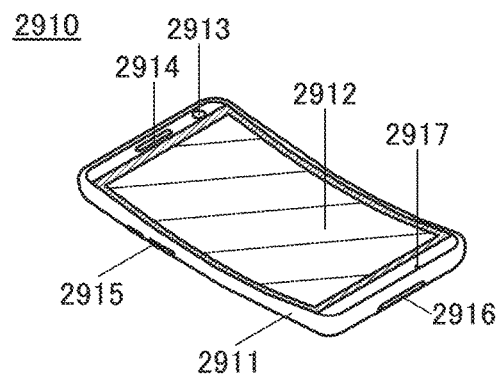

An information terminal 2910 illustrated in FIG. 14B includes a housing 2911 provided with a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 14C:
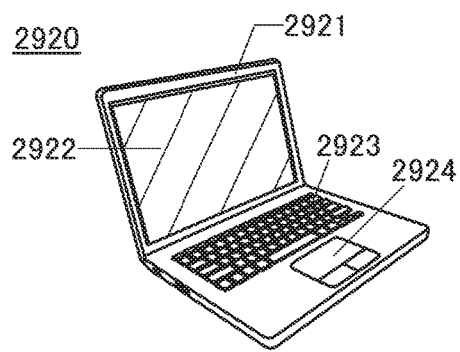

A notebook personal computer 2920 illustrated in FIG. 14C includes a housing 2921, a display portion 2922, a keyboard 2923, a pointing device 2924, and the like. In addition, the notebook personal computer 2920 includes an antenna, a battery, and the like inside the housing 2921.

Figure 14D:
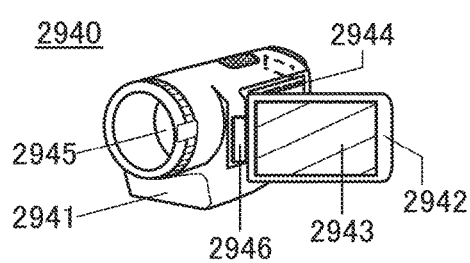

A video camera 2940 in FIG. 14D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

Figure 14E:
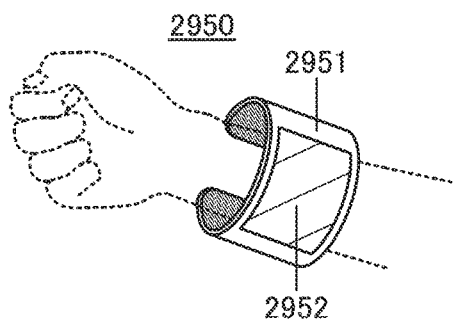

FIG. 14E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 14F:
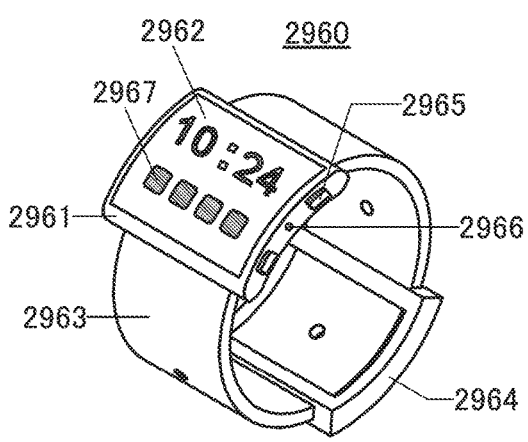

FIG. 14F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

Figure 14G:
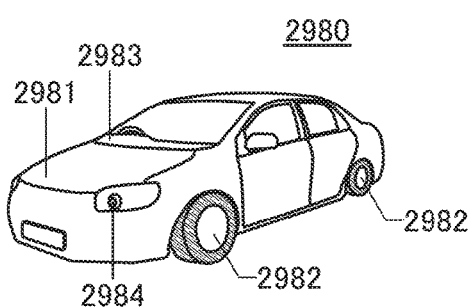

FIG. 14G is an external view illustrating an example of a car. A car 2980 includes a car body 2981, wheels 2982, a dashboard 2983, lights 2984, and the like. The car 2980 also includes an antenna, a battery, and the like.

For example, a memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments, Example, and the like.

Example 1

In this example, TDS measurement results of structures in which insulators are formed over substrates will be described. Note that in this example, Samples 1A, 1B, 1C, 1D, 1E, 1F, and 1G were fabricated.

<Structures and Fabrication Methods of Samples>

Figure 15A:
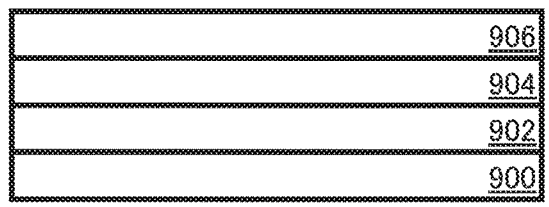
FIGS. 15A to 15C show a structure in Example and TDS results.

Samples 1A to 1G each of which is one embodiment of the present invention are described below. Samples 1B to 1G have a structure illustrated in FIG. 15A, and Sample 1A does not include an insulator 904.

Sample 1A includes a substrate 900, an insulator 902 over the substrate 900, and an insulator 906 over the insulator 902.

Samples 1B to 1G each include the substrate 900, the insulator 902 over the substrate 900, the insulator 904 over the insulator 902, and the insulator 906 over the insulator 904.

Note that the insulators 904 in Samples 1B to 1G were formed to have different thicknesses. Table 1 shows the thicknesses of the insulators 904 in Samples 1B to 1G. Note that the thickness of the insulator 904 in a fabricated sample was measured with the use of spectroscopic ellipsometer (manufactured by Full Automatic Spectroscopic Ellipsometer UT-300; HORIBA, Ltd.).

TABLE 1

|  | Thickness of insulator 904 [nm] |
|---|---|
| Sample 1A | — |
| Sample 1B | 1.1 |
| Sample 1C | 1.7 |
| Sample 1D | 2.1 |
| Sample 1E | 2.4 |
| Sample 1F | 2.6 |
| Sample 1G | 3.0 |

Next, methods for fabricating the samples will be described.

A silicon substrate was used as the substrate 900. Then, a 100-nm-thick thermal oxide film was formed as the insulator 902 over the substrate 900.

Next, an aluminum oxide film was formed as the insulator 904 over the insulator 902 by an ALD method. In the formation, the substrate temperature was 250° C., a source gas obtained by vaporization of a solid containing $Al(CH_3)_3$ was used, and an $O_3$ gas and an $O_2$ gas were used as oxidizing agents. Note that the thickness of the insulator 904 in each sample is shown in Table 1.

Subsequently, a 40-nm-thick aluminum oxide film was formed as the insulator 906 over the insulator 904 by a sputtering method. In the formation, an aluminum oxide ($Al_2O_3$) target was used, Ar at a flow rate of 25 sccm and $O_2$ at a flow rate of 25 sccm were used as sputtering gases, the substrate temperature was 250° C., the pressure was 0.4 Pa, the deposition power was 2.5 kW (RF), and the distance between the target and the substrate was 60 mm.

Through the above steps, Samples 1A to 1G in this example were fabricated.

<TDS Measurement Results of Samples>

Figure 15B:
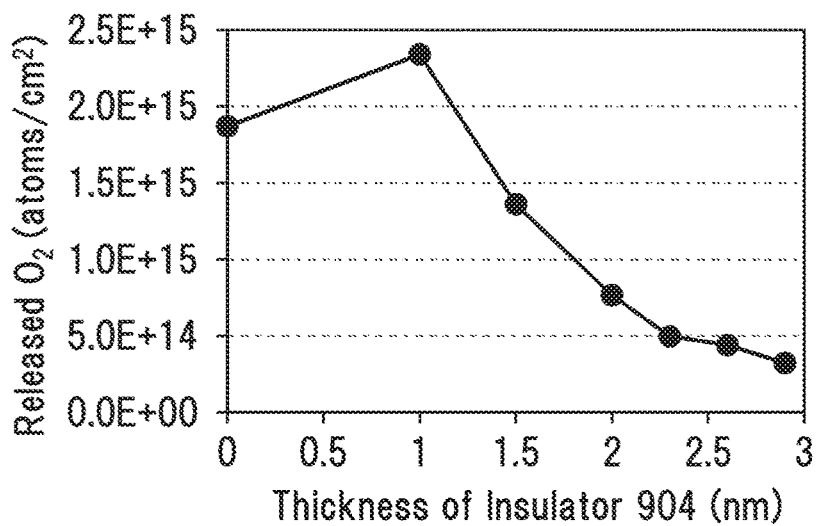
Figure 15C:
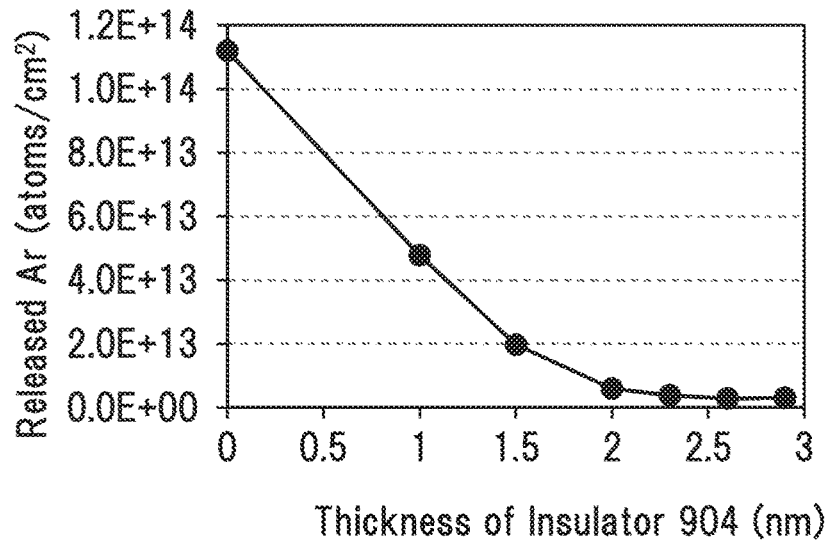

The amount of oxygen released from the insulator 902 in each sample was measured. In the TDS analysis, the amount of a released gas with a mass-to-charge ratio m/z of 32, which corresponds to an oxygen molecule, and the amount of a released gas with a mass-to-charge ratio m/z of 40, which corresponds to an argon atom, were measured. The TDS analysis was conducted with WA1000S manufactured by ESCO Ltd. at a heating rate of 32° C./min. FIGS. 15B and 15C show the measurement results.

FIG. 15B shows the amount of released oxygen in each sample, and FIG. 15C shows the amount of released argon in each sample. In each of FIGS. 15B and 15C, the longitudinal axis represents the amount of released oxygen or argon [atoms/cm$^2$] and the lateral axis represents the thickness of the insulator 904 [nm].

FIG. 15B indicates that in the case where the insulator 904 has a thickness of 3 nm or less, oxygen is introduced to the insulator 902 through the insulator 904 when the insulator 906 is formed. In particular, the amount of introduced oxygen is found to be larger in Sample 1B, which includes the insulator 904 with a thickness of approximately 1 nm, than in Sample 1A, which does not include the insulator 904.

In contrast, FIG. 15C indicates that the amount of argon introduced to the insulator 902 is reduced when the insulator 904 is provided, and that the amount of introduced argon decreases as the thickness of the insulator 904 increases. The insulator 904 probably reduces damage on the insulator 902 in the deposition using argon.

The above results indicate that the insulator 904 with a thickness of 3 nm or less enables oxygen to be introduced while the introduction of argon is reduced. In other words, the obtained insulator 902 has few impurities and includes excess oxygen. The above results also indicate that when the insulator 904 has a thickness of approximately 1 nm, oxygen can be introduced more effectively than when the insulator 904 is not provided.

The structure described in this example can be combined as appropriate with any of the structures described in the embodiments.

REFERENCE NUMERALS

100: capacitor 101: capacitor 110: conductor 112: conductor 120: conductor 130: insulator 150: insulator 200: transistor 201: transistor 205: conductor 205a: conductor 205A: conductive film 205b: conductor 205B: conductive film 210: insulator 212: insulator 214: insulator 216: insulator 218: conductor 220: insulator 222: insulator 224: insulator 230: oxide 230a: oxide 230A: oxide film 230b: oxide 230B: oxide film 230c: oxide 230C: oxide film 240: conductor 240a: conductor 240A: conductive film 240b: conductor 240B: conductive film 244: insulator 245a: barrier layer 245A: barrier film 245b: barrier layer 245B: barrier film 246: conductor 248: conductor 250: insulator 250A: insulating film 260: conductor 260a: conductor 260A: conductive film 260b: conductor 260B: conductive film 260c: conductor 260C: conductive film 270: barrier layer 272: insulator 274: insulator 280: insulator 282: insulator 286: insulator 290a: hard mask 290A: film 290b: hard mask 290B: film 300: transistor 301: transistor 311: substrate 313: semiconductor region 314a: low-resistance region 314b: low-resistance region 315: insulator 316: conductor 320: insulator 322: insulator 324: insulator 326: insulator 328: conductor 330: conductor 350: insulator 352: insulator 354: insulator 356: conductor 400: transistor 405a: conductor 405b: conductor 430c: oxide 431a: oxide 431b: oxide 432a: oxide 432b: oxide 440: conductor 440a: conductor 440b: conductor 441a: conductor 441b: conductor 450: insulator 460a: conductor 460b: conductor 470: barrier layer 500: structure 711: substrate 712: circuit region 713: separation region 714: separation line 715: chip 750: electronic component 752: printed circuit board 754: circuit board 755: lead 900: substrate 902: insulator 904: insulator 906: insulator 2900: portable game machine 2901: housing 2902: housing 2903: display portion 2904: display portion 2905: microphone 2906: speaker 2907: operation switch 2908: stylus 2910: information terminal 2911: housing 2912: display portion 2913: camera 2914: speaker portion 2915: operation switch 2916: external connection portion 2917: microphone 2920: notebook personal computer 2921: housing 2922: display portion 2923: keyboard 2924: pointing device 2940: video camera 2941: housing 2942: housing 2943: display portion 2944: operation switch 2945: lens 2946: connection portion 2950: information terminal 2951: housing 2952: display portion 2960: information terminal 2961: housing 2962: display portion 2963: band 2964: buckle 2965: operation switch 2966: input/output terminal 2967: icon 2980: car 2981: car body 2982: wheel 2983: dashboard 2984: light 3001: wiring 3002: wiring 3003: wiring 3004: wiring 3005: wiring 3006: wiring 3007: wiring 3008: wiring 3009: wiring 3010: wiring This application is based on Japanese Patent Application Serial No. 2016-179466 filed with Japan Patent Office on Sep. 14, 2016, the entire contents of which are hereby incorporated by reference.

The invention claimed is:

1. A semiconductor device comprising:
a transistor including an oxide, a gate electrode, and an insulator;
a first barrier layer in contact with the insulator; and
a second barrier layer in contact with the first barrier layer,
wherein the insulator includes an excess-oxygen region, is provided over and in contact with the oxide, and extends beyond an edge of the gate electrode,
wherein the first barrier layer has a thickness greater than or equal to 0.5 nm and less than or equal to 1.5 nm, and
wherein the second barrier layer is thicker than the first barrier layer.

2. The semiconductor device according to claim 1, wherein the second barrier layer has a thickness greater than or equal to 3 nm.

3. The semiconductor device according to claim 1, wherein the insulator serves as a gate insulator.

4. The semiconductor device according to claim 1, wherein the oxide is an In-M-Zn oxide, wherein the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

5. The semiconductor device according to claim 1,
wherein each of the first barrier layer and the second barrier layer contains one of silicon oxide, silicon oxynitride, silicon nitride oxide, aluminum oxide, hafnium oxide, tantalum oxide, zirconium oxide, lead zirconate titanate, strontium titanate, and (Ba,Sr)TiO3.

6. The semiconductor device according to claim 1, further comprising:
a first insulator under the transistor; and
a second insulator over the second barrier layer.

7. The semiconductor device according to claim 6,
wherein each of the first insulator and the second insulator contains one of silicon nitride oxide, aluminum oxide, hafnium oxide, tantalum oxide, zirconium oxide, lead zirconate titanate, strontium titanate, and (Ba,Sr)TiO3.

8. A semiconductor device comprising:
a transistor including an oxide and a first insulator;
a first barrier layer in contact with the first insulator;
a second barrier layer in contact with the first barrier layer; and
a second insulator including a second excess-oxygen region over the second barrier layer,
wherein the first insulator includes a first excess-oxygen region,
wherein the first barrier layer has a thickness greater than or equal to 0.5 nm and less than or equal to 1.5 nm, and
wherein the second barrier layer is thicker than the first barrier layer.

9. The semiconductor device according to claim 8, wherein the second barrier layer has a thickness greater than or equal to 3 nm.

10. The semiconductor device according to claim 8, wherein the second insulator serves as an interlayer insulator.

11. The semiconductor device according to claim 8, wherein the oxide is an In-M-Zn oxide, wherein the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

12. The semiconductor device according to claim 8,
wherein each of the first barrier layer and the second barrier layer contains one of silicon oxide, silicon oxynitride, silicon nitride oxide, aluminum oxide, hafnium oxide, tantalum oxide, zirconium oxide, lead zirconate titanate, strontium titanate, and (Ba,Sr)TiO3.

13. The semiconductor device according to claim 8, further comprising:
a third insulator under the transistor; and
a fourth insulator over the second insulator.

14. The semiconductor device according to claim 13,
wherein each of the third insulator and the fourth insulator contains one of silicon nitride oxide, aluminum oxide, hafnium oxide, tantalum oxide, zirconium oxide, lead zirconate titanate, strontium titanate, and (Ba,Sr)TiO3.

15. A method for manufacturing a semiconductor device, comprising the steps of:
forming a transistor including an insulator, an oxide, and a gate electrode;
forming a first barrier layer over the transistor by an ALD method to a thickness greater than or equal to 0.5 nm and less than or equal to 1.5 nm, and
forming a second barrier layer over the first barrier layer by a sputtering method to a thickness greater than that of the first barrier layer, so that an excess-oxygen region is formed in the insulator,
wherein the insulator is provided over and in contact with the oxide and extends beyond an edge of the gate electrode.

16. The method for manufacturing a semiconductor device, according to claim 15, wherein the second barrier layer has a thickness greater than or equal to 3 nm.

17. The method for manufacturing a semiconductor device, according to claim 15, wherein the insulator serves as a gate insulator.

18. The method for manufacturing a semiconductor device, according to claim 15, wherein the oxide is an In-M-Zn oxide, wherein the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

19. The method for manufacturing a semiconductor device, according to claim 15,
wherein each of the first barrier layer and the second barrier layer contains one of silicon oxide, silicon oxynitride, silicon nitride oxide, aluminum oxide, hafnium oxide, tantalum oxide, zirconium oxide, lead zirconate titanate, strontium titanate, and (Ba,Sr)TiO3.

20. The method for manufacturing a semiconductor device, according to claim 15, further comprising:
forming a first insulator before forming the transistor; and
forming a second insulator after forming the second barrier layer.

21. The method for manufacturing a semiconductor device, according to claim 20,
wherein each of the first insulator and the second insulator contains one of silicon nitride oxide, aluminum oxide, hafnium oxide, tantalum oxide, zirconium oxide, lead zirconate titanate, strontium titanate, and (Ba,Sr)TiO3.

22. A method for manufacturing a semiconductor device, comprising the steps of:
forming a transistor including an oxide, a first insulator, and a gate electrode;
forming a first barrier layer over the first insulator by an ALD method to a thickness greater than or equal to 0.5 nm and less than or equal to 1.5 nm, forming a second barrier layer over the first barrier layer by a sputtering method to a thickness greater than that of the first barrier layer; and forming a second insulator including a second excess-oxygen region over the second barrier layer, wherein the first insulator including a first excess-oxygen region.

23. The method for manufacturing a semiconductor device, according to claim 22, wherein the second barrier layer has a thickness greater than or equal to 3 nm.

24. The method for manufacturing a semiconductor device, according to claim 22, wherein the second insulator serves as an interlayer insulator.

25. The method for manufacturing a semiconductor device, according to claim 22, wherein the oxide is an In-M-Zn oxide, wherein the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

26. The method for manufacturing a semiconductor device, according to claim 22, wherein each of the first barrier layer and the second barrier layer contains one of silicon oxide, silicon oxynitride, silicon nitride oxide, aluminum oxide, hafnium oxide, tantalum oxide, zirconium oxide, lead zirconate titanate, strontium titanate, and (Ba,Sr)TiO3.

27. The method for manufacturing a semiconductor device, according to claim 22, further comprising:

forming a third insulator before forming the transistor; and forming a fourth insulator after forming the second barrier layer.

28. The method for manufacturing a semiconductor device, according to claim 27, wherein each of the third insulator and the fourth insulator contains one of silicon nitride oxide, aluminum oxide, hafnium oxide, tantalum oxide, zirconium oxide, lead zirconate titanate, strontium titanate, and (Ba,Sr)TiO3.

29. A semiconductor device comprising:

a transistor including an oxide, a gate electrode, and an insulator;

a first barrier layer in contact with the insulator; and a second barrier layer in contact with the first barrier layer, wherein the insulator includes an excess-oxygen region, is provided over and in contact with the oxide, and extends beyond an edge of the gate electrode, and wherein the second barrier layer is thicker than the first barrier layer.

30. The semiconductor device according to claim 29, wherein the insulator serves as a gate insulator.

31. The semiconductor device according to claim 29, wherein the oxide is an In—M—Zn oxide, wherein the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

32. The semiconductor device according to claim 29, wherein each of the first barrier layer and the second barrier layer contains one of silicon oxide, silicon oxynitride, silicon nitride oxide, aluminum oxide, hafnium oxide, tantalum oxide, zirconium oxide, lead zirconate titanate, strontium titanate, and (Ba,Sr)TiO3.

33. The semiconductor device according to claim 29, further comprising:

a first insulator under the transistor; and a second insulator over the second barrier layer.

34. The semiconductor device according to claim 33, wherein each of the first insulator and the second insulator contains one of silicon nitride oxide, aluminum oxide, hafnium oxide, tantalum oxide, zirconium oxide, lead zirconate titanate, strontium titanate, and (Ba,Sr)TiO3.

35. A semiconductor device comprising:

a transistor including an oxide and a first insulator;

a first barrier layer in contact with the first insulator;

a second barrier layer in contact with the first barrier layer; and a second insulator including a second excess-oxygen region over the second barrier layer, wherein the first insulator includes a first excess-oxygen region, and wherein the second barrier layer is thicker than the first barrier layer.

36. The semiconductor device according to claim 35, wherein the second insulator serves as an interlayer insulator.

37. The semiconductor device according to claim 35, wherein the oxide is an In—M—Zn oxide, wherein the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

38. The semiconductor device according to claim 35, wherein each of the first barrier layer and the second barrier layer contains one of silicon oxide, silicon oxynitride, silicon nitride oxide, aluminum oxide, hafnium oxide, tantalum oxide, zirconium oxide, lead zirconate titanate, strontium titanate, and (Ba,Sr)TiO3.

39. The semiconductor device according to claim 35, further comprising:

a third insulator under the transistor; and a fourth insulator over the second insulator.

40. The semiconductor device according to claim 39, wherein each of the third insulator and the fourth insulator contains one of silicon nitride oxide, aluminum oxide, hafnium oxide, tantalum oxide, zirconium oxide, lead zirconate titanate, strontium titanate, and (Ba,Sr)TiO3.

* * * * *